United States Patent
Sato et al.

(10) Patent No.: US 6,864,493 B2
(45) Date of Patent: Mar. 8, 2005

(54) CHARGED PARTICLE BEAM ALIGNMENT METHOD AND CHARGED PARTICLE BEAM APPARATUS

(75) Inventors: Mitsugu Sato, Hitachinaka (JP); Tadashi Otaka, Hitachinaka (JP); Makoto Ezumi, Mito (JP); Atsushi Takane, Mito (JP); Shoji Yoshida, Hitachi (JP); Satoru Yamaguchi, Hitachinaka (JP); Yasuhiko Ozawa, Abiko (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/082,288

(22) Filed: Feb. 26, 2002

(65) Prior Publication Data

US 2002/0179851 A1 Dec. 5, 2002

(30) Foreign Application Priority Data

May 30, 2001 (JP) .................................. 2001-161588
Jul. 10, 2001 (JP) .................................. 2001-208674

(51) Int. Cl.$^7$ ............................................... H01J 37/04
(52) U.S. Cl. .................................................. 250/491.1
(58) Field of Search ................................. 250/310, 311, 250/305, 306, 307, 491.1, 492.2, 201.3, 396 R, 398, 559.27; 382/199; 324/751; 355/53

(56) References Cited

U.S. PATENT DOCUMENTS

| | | | |
|---|---|---|---|
| 5,463,221 A | | 10/1995 | Otaka et al. |
| 5,627,373 A | * | 5/1997 | Liu et al. ..................... 250/310 |
| 5,659,172 A | * | 8/1997 | Wagner et al. .............. 250/307 |
| 6,333,510 B1 | * | 12/2001 | Watanabe et al. ...... 250/559.27 |

FOREIGN PATENT DOCUMENTS

| | | |
|---|---|---|
| JP | 2000-195453 | 7/2000 |
| JP | 2000-331637 | 11/2000 |

* cited by examiner

*Primary Examiner*—John R. Lee
*Assistant Examiner*—Phillip Johnston
(74) *Attorney, Agent, or Firm*—Dickstein Shapiro Morin & Oshinsky LLP

(57) ABSTRACT

An object of the present invention is to provide a charged particle beam apparatus and an alignment method of the charged particle beam apparatus, which make it possible to align an optical axis of a charged particle beam easily even when a state of the charged particle beam changes. The present invention comprises calculation means for calculating a deflection amount of an alignment deflector which performs an axis alignment for an objective lens, a plurality of calculation methods for calculating the deflection amount is memorized in the calculation means, and a selection means for selecting at least one of the calculation methods is provided.

24 Claims, 13 Drawing Sheets

FIG.5

AXIS DEVIATION RELATIVE TO OBJECTIVE LENS EXCEED TOLERANCE LEVEL. DO YOU EXECUTE AXIS ALIGNMENT ?

Yes          No

CHARGED PARTICLE BEAM ALIGNMENT METHOD AND CHARGED PARTICLE BEAM APPARATUS

BACKGROUND OF THE INVENTION

1. Field of the Invention

The present invention relates to a charged particle beam apparatus, more particularly to a charged particle beam apparatus which corrects an optical axis deviation of a charged particle optical system and is suitable for obtaining a high resolution image.

2. Discussion of the Background

A charged particle beam apparatus typified by a scanning electron microscope acquires desired information, for example, a sample image, from a sample by scanning a finely converged charged particle beam thereonto. Because, in such a charged particle beam apparatus, lens aberration occurs and a resolution of the sample image decreases with an optical axis deviation relative to a lens, a high precision axis alignment is required to acquire a high resolution sample image. Therefore, excitation current of an objective lens and the like were periodically changed in a conventional axis alignment, and operational conditions of a deflector (aligner) for the axis alignment was manually adjusted so as to minimize a motion thereof at this time. As a technology for performing the axis alignment automatically, there is one disclosed in Japanese Patent Laid-Open No. 2000-195453. According to descriptions of this gazette, disclosed is the technology for changing an excitation set value of an alignment coil based on a transition of an electron beam radiation position which changes between two excitation conditions of the objective lens. Moreover, in Japanese Patent Laid-Open No. 2000-331637, a technology is disclosed, which performs a focus correction based on a detection of a position deviation between two electron microscope image obtained under different optical conditions.

If the lens deviates from a center of an astigmatism corrector for performing an astigmatism correction of a charged particle beam, a field of view moves in aligning astigmatism, and the alignment of the astigmatism becomes difficult. Therefore, another aligner (deflector) which controls the position of the charged particle on the sample in association with an operation of the astigmatism corrector is provided, and a motion of an image relative to a change of a set value of the astigmatism corrector is cancelled, thus performing a correction of the field of view so that an observed image does not move in aligning the astigmatism. At this time, though a signal in proportion to the set value of the astigmatism corrector is input to the aligner for correcting the field of view, a proportional coefficient must be determined so as to cancel the motion of the image in aligning the astigmatism. To perform this alignment, an operation, in which the set value such as current and the like of the astigmatism corrector was periodically changed and a proportional coefficient to minimize a motion of an image at this time is determined, was carried out.

SUMMARY OF THE INVENTION

To perform the alignment of the optical axis manually as described above, a technique supported by experience is necessary, so that an alignment precision varies depending on an operator and a time is required for the alignment in some cases. Moreover, with respect to the above described automatic alignment of the optical axis, parameter for the alignment changing depending on optical conditions must be memorized for each optical condition. When an observation is tried by changing the optical condition, a register operation is required for each optical condition. Even if the parameters for the alignment were used under the same optical condition, there is a problem that an alignment based on the registered parameters is difficult because of a change of the optical axis with the passage of time. Furthermore, there is a possibility that the operator performs an observation based on a sample image deteriorated without noticing that the optical axis deviates.

An object of the present invention is to provide a method of aligning a charged particle beam and a charged particle beam apparatus, which make it possible to align an optical axis easily even when an optical condition is changed or even when a state of a charged particle beam changes by a change of the optical axis with the passage of time.

Another object of the present invention is to provide a charged particle beam apparatus suitable for enabling an optical axis to be automatically aligned.

To achieve the foregoing objects, the present invention provides a method of aligning a charged particle beam and a charged particle beam apparatus, in which when a deflection condition of an alignment deflector is set to a first state in aligning an axis of a charged particle beam relative to an optical device influencing the charged particle beam with an alignment deflector, the optical device is changed into at least two states, and a first deviation between first and second sample images obtained at this time is detected, and when the deflection condition of the alignment deflector is set to a second state, the optical device is changed into at least two states, a second deviation between third and fourth sample images obtained at this time is detected, and an operation condition of the alignment deflector is determined based on information concerning the first and second deviations.

According to the constitution described above, an axis alignment with a high precision is possible irrespective of an optical condition of the charged particle beam.

To achieve another object of the present invention, provided is a charged particle beam apparatus which comprises a charged particle source, an optical device for aligning a charged particle beam emitted from the charged particle source, and an alignment deflector for performing an axis alignment for the optical device, the charged particle beam apparatus further comprising calculation means for calculating a deflection amount of the alignment deflector, wherein a plurality of calculation methods for calculating the deflection amount are memorized in the calculation means, and selection means for selecting the calculation methods is provided.

According to the constitution described above, it is possible to execute the axis alignment with a high precision automatically irrespective of an optical condition of the charged particle beam. Note that another constitution of the present invention will be described in describing embodiments of the invention in detail.

BRIEF DESCRIPTION OF THE DRAWINGS

FIG. 5 is a drawing illustrating an example of a message when the axis deviation is detected.

DETAILED DESCRIPTION OF THE PREFERRED EMBODIMENTS

Embodiments of the present invention will be described with reference to the accompanying drawings below.

Figure 1:
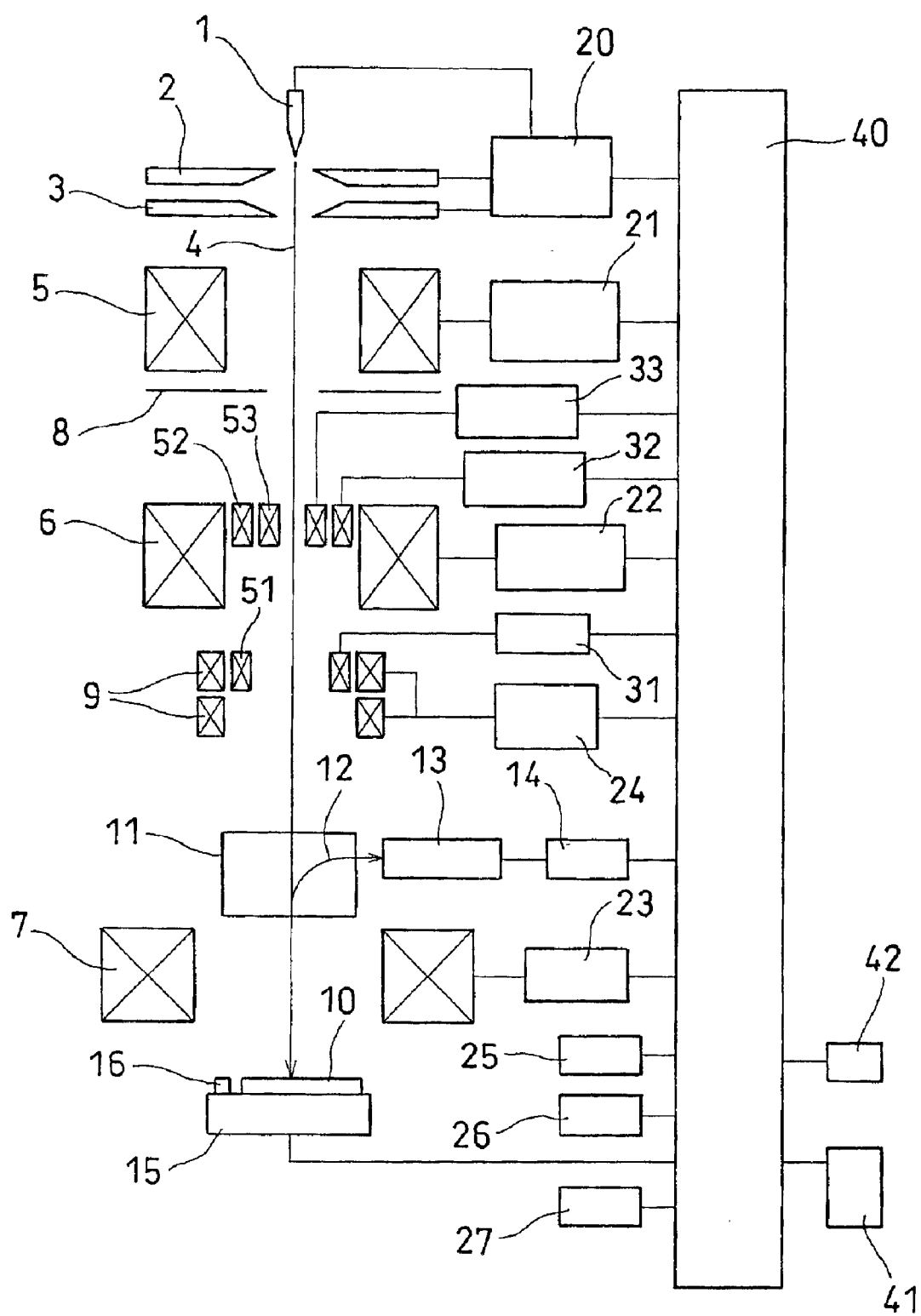
FIG. 1 is a block diagram illustrating an outline of a constitution of a scanning electron microscope as an example of the present invention.

FIG. 1 is an outline of a constitution of a scanning electron microscope as an example of the present invention. A voltage is applied between a negative electrode 1 and a first positive electrode 2 by a high voltage control power source 20 controlled by a computer 40, and a primary electron beam 4 is drawn out from the negative electrode 1 with a predetermined emission current. An acceleration voltage is applied between the negative electrode 1 and a second positive electrode 3 by the high voltage control power source 20 controlled by the computer 40, and the primary electron beam 4 emitted from the negative electrode 1 is accelerated. The primary electron beam 4 is accelerated to advance to a lens system at a rear stage. The primary electron beam 4 is converged by a convergence lens 5 controlled by a lens control power source 21, and an unnecessary region of the primary electron beam 4 is removed by a diaphragm plate 8. Thereafter, the primary electron beam 4 is converged by a convergence lens 6 controlled by a lens control power source 22 and an objective lens 7 controlled by an objective lens control power source 23 onto a sample 10 as a minute spot. The objective lens 7 can adopt various styles such as an in-lens style, an out-lens style and a snorkel-type (semi in-lens style). Moreover, a retarding style can be adopted, which applies a negative voltage to a sample to reduce the speed of the primary electron beam. Still furthermore, each lens may be constituted by an electrostatic lens constituted by a plurality of electrodes.

The primary electron beam 4 is scanned on the sample 10 by a scanning coil 9 two-dimensionally. A secondary signal 12 such as secondary electrons generated from the sample 10 by radiation of the primary electron beam advances to an upper portion of the objective lens 7 and thereafter is separated from the primary electrons by an orthogonal electromagnetic field (EXB) generator 11 for a secondary signal separation. The secondary signal is detected by a secondary signal detector 13. The signal detected by the secondary signal detector 13 is amplified by a signal amplifier 14 and then transferred to an image memory 25 to be displayed as a sample image on an image display device 26.

A one-stage deflection coil 51 (an aligner for the objective lens) is disposed in the vicinity of the scanning coil 9 or at the same position thereof and operates as the aligner for the objective lens. An octupole astigmatism correction coil 52 (astigmatism corrector) for correction of astigmatism in the X and Y-directions is disposed between the objective lens and the diaphragm plate. An aligner 53 for correcting an axis deviation of the astigmatism correction coil is disposed in the vicinity of the astigmatism coil or at the same position thereof.

It is possible to allow the image display device 26 to display a button for instructing a confirmation of axis conditions and a start of an automatic axis alignment in addition to the sample image and various operation buttons for setting an electron optical system and scanning conditions.

When a focus adjustment is performed in a state where the primary electron beam passes through a position deviating from a center of the objective lens, that is, in a state where an axis of the objective lens deviates, a motion of a field of view occurs accompanied with a focus adjustment. When an operator notices the axis deviation, he/she can instruct a start of an axis alignment processing by an operation such as clicking a processing start button displayed on the display device with a mouse. Upon receipt of the instruction of the axis alignment from the operator, the computer 40 starts the procedures according to the flowchart described in the following embodiment.

Although the descriptions of FIG. 1 were made on condition that the control processing section is provided integrally with the scanning electron microscope or provided so as to form the similar to this constitution, the arrangement of the control processing section is, as a matter of course, not limited to this, and the processing described below may be performed by use of a control processor provided separately from the scanning electron microscope barrel. When such a constitution is adopted, a transmission medium which transmits a detection signal detected by the secondary signal detector 13 to the control processor and transmits a signal from the control processor to a lens and a deflector of the scanning electron microscope is necessary as well as an input/output terminals which input and output the signal transmitted via the transmission medium. Moreover, a program for executing the processing described below may be previously registered in a recording medium, and this program may be executed by a control processor which has an image memory and supplies a signal necessary for the scanning electron microscope.

The sample 10 is set on a stage 15. The stage 15 is moved by a control signal from the computer 40, whereby the primary electron beam 4 can move to any position on the sample or the stage. An exclusive pattern 16 for performing a beam alignment can be disposed on the stage.

It is possible to previously set automatic operation conditions by the image display device 26 and an input device 42 such as a mouse and a keyboard. The automatic operation conditions are stored in a storage device 41 as a recipie file. In the recipie file, conditions for executing the automatic axis alignment are also included.

(Embodiment 1)

The processing flowchart of FIG. 2 will be described in detail below.

First Step:

The present conditions of the objective lens 7 or conditions determined based on the present conditions, for example, conditions in which a focus is slightly deviated from the present focus conditions, are set for the objective lens 7 as the condition 1. Next, the present conditions of the aligner 51 or conditions determined in advance are set as the conditions 1 of the aligner 51. An image 1 is acquired by the objective lens condition 1 and the aligner condition 1.

Second Step:

The condition of the aligner 51 is kept intact, and only the objective lens condition is set to second focus condition in which a focus deviates from the objective lens condition 1 by a value previously determined, thus obtaining an image 2.

Third Step and Fourth Step:

A condition in which the condition of the aligner 51 is changed by a predetermined value for the condition 1 is set in the aligner 51 as the condition 2. Then, the condition of the objective lens is set to the conditions 1 and 2 similarly to the steps 1 and 2, thus respectively obtaining images (image 3 and image 4).

Fifth Step:

An image is acquired again under the same condition as the image 1 and registered as an image 5.

Sixth Step:

Parallax (image deviation) between the images 1 and 2 is detected by an image processing and registered as parallax 1. For example, an image correlation is obtained while shifting the pictures of the images 1 and 2 from each other at a pixel unit, and the parallax between the images can be detected based on a shift amount of one picture from the other at which an image correlation value becomes maximum. In addition, if an image processing capable of detecting parallax is adopted, this image processing can be applied to this embodiment.

Seventh Step:

Parallax between the images 3 and 4 is detected by the image processing and registered as parallax 2.

Eighth Step:

Parallax between the images 1 and 5 is detected by the image processing and registered as parallax 3. Because the images 1 and 5 are acquired under the same condition, if there is a difference (parallax 3) between these images, this difference is produced by a drift of the sample and a beam. Specifically, when the optical condition of the charged particle beam is rendered to a certain state (first state), and then the optical condition is rendered to another state (second state), followed by restoring the optical condition to the first state, the sample images are respectively detected under the above described two first states, and the drift is calculated based on the difference between both of the sample images.

Ninth Step:

A drift component is detected from the parallax 3, and the drift component is corrected (removed) for the parallax 1 and the parallax 2. For example, if a fetching interval of the images 1 and 5 is t seconds, a drift (d) per unit time is represented by d=(parallax 3)/t. On the other hand, when the fetching interval of the images 1 and 2 is set to T12 and the fetching interval of the images 3 and 4 is set to T34, the drift components of d×T12 and d×T34 are included in the parallaxes 1 and 2, respectively. Therefore, by extracting the drift component from the parallaxes 1 and 2, a precision parallax resulting from the axis deviation can be calculated.

Tenth Step and Eleventh Step:

An optimum value of the aligner 51 is calculated based on the parallaxes 1 and 2 which have been subjected to the drift correction and set to the aligner.

Figure 2:
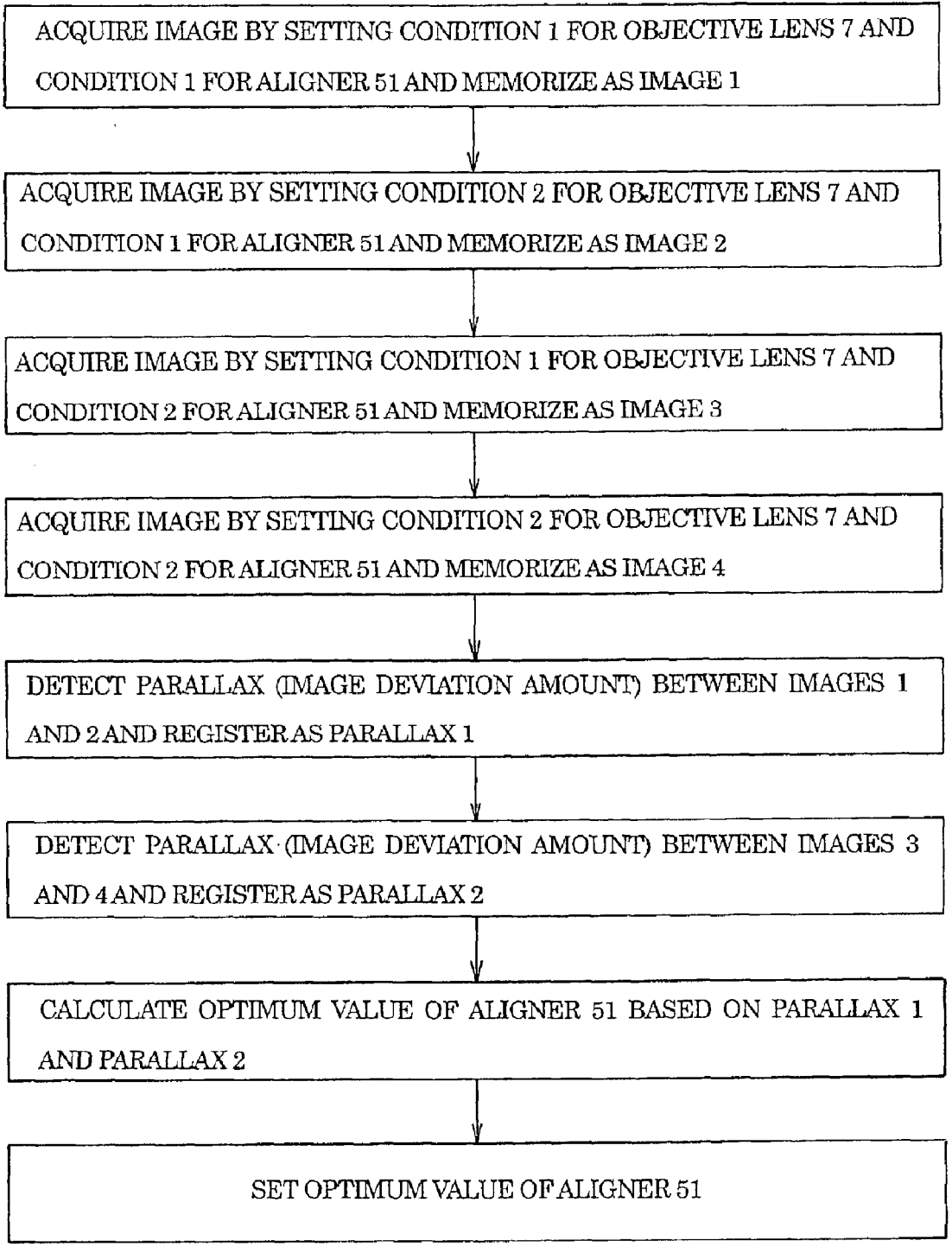
FIG. 2 is an outline of a processing flow for correcting an axis deviation relative to an objective lens.

Although the processing flowchart of FIG. 2 was described according to the procedures that can be understood easily, the fetching order of the images do not influence the processing except for the first and last images for correcting the drift. In an actual processing, to speed up the processing, the objective lens 7 condition is set to the condition 1, and the images 1 and 3 can be continuously fetched. Next, the objective lens 7 condition is set to the condition 2, and the images 2 and 4 can be continuously fetched. Because an objective lens of an electron microscope is usually constituted by a magnetic lens and has large inductance, a method of continuously controlling an aligner which has less inductance and can perform a high speed control is practically effective.

Figure 3:
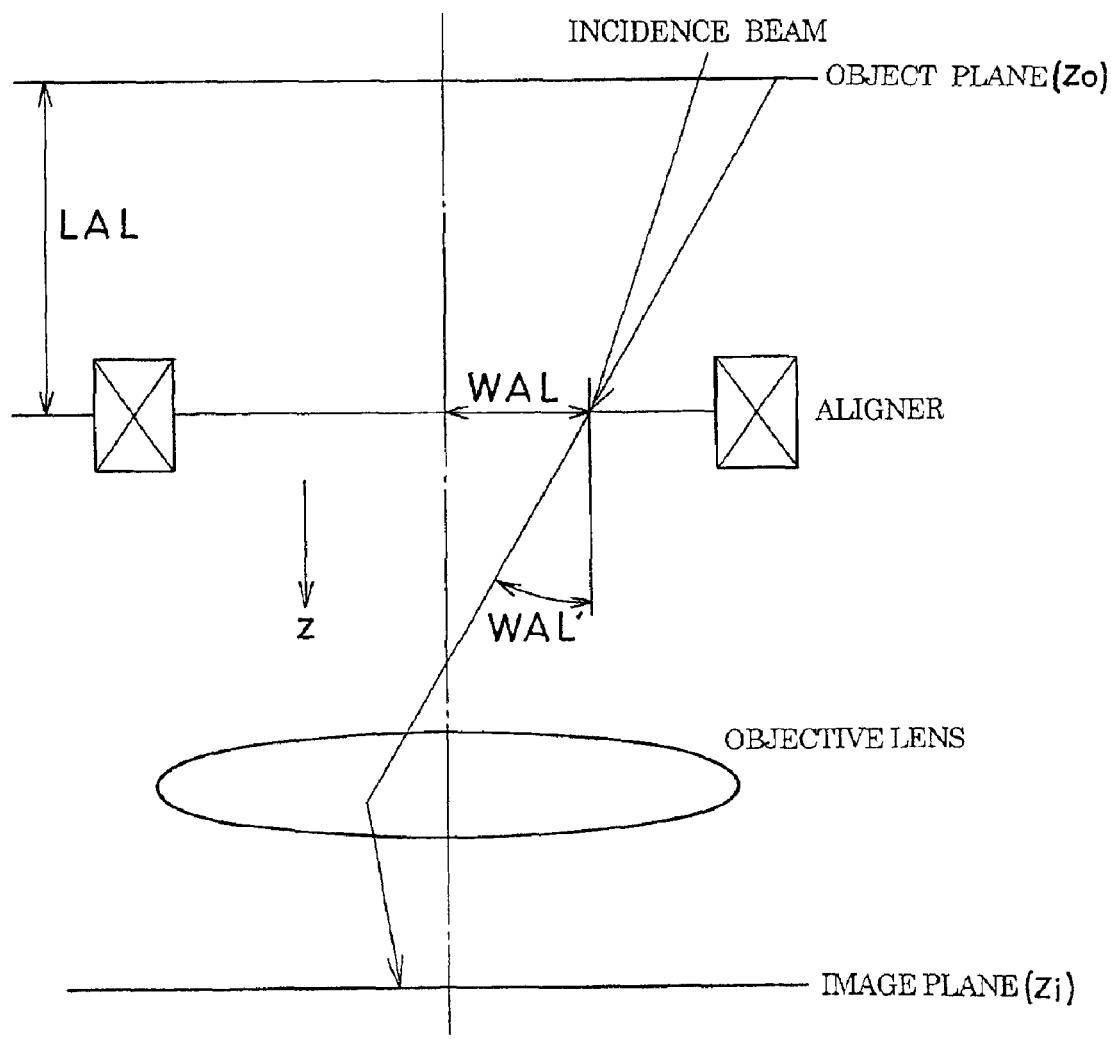
FIG. 3 shows a principle for correcting the axis deviation relative to the objective lens.

A principle by which an axis deviation relative to the objective lens is corrected (amended) according to the processing flowchart of FIG. 2 will be described with reference to FIG. 3. Assuming that, in a state of the axis deviation, a beam deviation axis amount at a position (deflected plane) of the aligner 51 be WAL (complex variable: XAL+j·YAL, j: imaginary unit) and a slant of the beam relative to the optical axis at this position be WAL' (complex variable), an orbital calculation based on an electro-optics theory (paraxial theory) is available. In the case of a magnetic objective lens, assuming that an image deviation amount (parallax produced when a lens current value is changed from I1 to I2 by ΔI(=I1−I2) be ΔWi (complex variable: ΔXi+j·ΔYi), ΔWi can be expressed by the following formula, $$\Delta Wi = K \cdot \Delta I \cdot (WAL \cdot A + WAL' \cdot B) \tag{1}$$

where K, A and B are parameters (complex numbers) determined by an axis deviation state in measurements and operation conditions of the objective lens (such as an acceleration voltage, a focal distance or a position of the objective lens). The state where the axis deviates relative to the objective lens means that ΔWi has a value other than zero in the formula (1). Accordingly, conventionally, the current of the objective lens was changed periodically by ΔI, and the operator recognized the image deviation ΔWi. He/she adjusted the condition of the aligner to removed the image deviation. Specifically, an optimum value of the aligner for which the axis deviation is corrected indicates a condition in which the right side of the formula (1) is zero irrespective of ΔI. When this condition is written in the form of a formula, the following formula (2) is obtained.

$$(WAL \cdot A + WAL' \cdot B) = 0 \tag{2}$$

An operation condition of the aligner satisfying this condition is the optimum value. If the axis deviation exists, because a tilt of an incidence beam exists in the aligner deflected plane, this tilt is expressed as WAL0', and a deflection angle (controlled value) by the aligner is expressed as WAL1'. The tilt of the beam relative to the optical axis is expressed by the following formula (3).

$$WAL' = WAL0' + WAL1' \tag{3}$$

Accordingly, to obtain the condition WAL1' (the optimum value of the aligner) of the aligner satisfying the formula (2) is an object of the axis alignment function. In the case where the aligner is constituted by an electromagnetic coil, the deflection angle WAL1' is in proportion to a coil current of the aligner. When the formula (1) is rewritten using the above described relations, the following formula (4) is obtained.

$$\Delta Wi = \Delta I \cdot (A1 + WAL1' \cdot B1) \tag{4}$$

In the formula (4), A1 and B1 are expressed by the following formulas (5) and (6).

$$A1=K\cdot(WAL\cdot A+WAL0'\cdot B) \quad (5)$$

$$B1=K\cdot B \quad (6)$$

From the formula (4), the optimum value WAL1' of the aligner is given by the following formula (7).

$$WAL1'=-A1/B1 \quad (7)$$

Accordingly, it is possible to calculate the optimum value of the aligner by obtaining A1 and B1. In the formula (4), since ΔI is the current change amount of the objective lens, ΔI can be determined previously as a known value. Accordingly the aligner is set to arbitrary two conditions previously determined and, for each of these conditions, the parallax ΔWi relative to ΔI is detected by the image processing. At this time, formulas for obtaining the unknowns A1 and B1 from the formula (4) can be obtained. Since the unknowns A1 and B1 can be solved based on these formulas, the optimum condition of the aligner can be determined based on the formula (7).

Specifically, the unknowns A and B are calculated from the equation including A and B before calculating the aligner condition that makes the parallax ΔWi small (ideally zero) when the objective lens is set to the predetermined two conditions. The aligner condition, that is, an excitation condition of the aligner, can be deduced based on this condition. Note that the aligner 51 has an arrangement or a structure which is capable of controlling a beam passage position two-dimensionally at least in a main plane of the objective lens. This is because if a deflection fulcrum of the beam by the aligner exists in the vicinity of the main plane of the objective lens, a state of the axis deviation relative to the objective lens cannot be controlled. Specifically, in the case of the alignment deflector (aligner) using the electromagnetic coil like this embodiment of the present invention, it is possible to detect an excitation current (deflection signal) supplied to the coil, which changes depending on an optical condition. For example since the excitation current, which changes depending on a change of an excitation condition of the objective lens and depending on a level of a retarding voltage applied to the sample, can be detected based on the optical conditions in observation, it is unnecessary to register parameters different for each optical condition previously. Even if a condition of the beam changes by a change due to the passage of time, an excitation current supplied to a proper alignment coil in the state where the beam condition changes can be detected.

As described above, this embodiment of the present invention can cope with a changing state of the axis deviation and operation conditions of an optical device in the charged particle optical system, which include beam energy, a focus distance and an optics magnification, and it is possible to realize an automatic axis alignment easily.

The magnitude of the axis deviation can be quantized by the magnitude of the parallax ΔWi relative to ΔI. Therefore, when an operation such as a sample exchange and a condition change of the electron optical system, which may cause the axis deviation, is performed, the axis deviation can be detected previously as long as a processing to detect the parallax ΔWi due to ΔI is executed. Moreover, when the parallax ΔWi exceeds a predetermined value, a message can be displayed, which informs the operator that he/she must perform the axis alignment. An example of a message screen when the axis deviation is detected is shown in FIG. 5. The operator can execute the axis alignment processing by the input means according to this message if necessary. The input means can adopt various styles in which, for example, icons displayed on the message screen (for example, FIG. 5) and other exclusive icons displayed on a monitor are clicked by use of a mouse or a processing command is designated from a menu screen.

(Embodiment 2)

On the other hand, with respect to the astigmatism corrector 52, an automatic axis alignment is possible in this embodiment. In the astigmatism corrector, on a plane perpendicular to the optical axis, an action to converge the beam and an action to diverge the beam are generated in different directions. Accordingly, if the beam does not pass through the center of an astigmatism correction field, the beam will be subjected to a deflection action in a direction corresponding to the deviation from the center of the astigmatism correction field. At this time, because the deflection action also changes in association with the correction of the astigmatism, the image moves in association with the alignment operation for the astigmatism, and the alignment operation is difficult. To correct the movement of the image, conventionally, a signal in association with a signal (Xstg, Ystg) of the astigmatism corrector 52 was input to another aligner 53, and the movement of the image by the astigmatism corrector was cancelled by a movement of the image generated by the aligner 53. At this time, when the signal (complex variable) input to the aligner 53 is expressed by Ws1, Ws1 is expressed by the following formula (8), $$Ws1=Ksx\cdot Xstg+Ksy\cdot Ystg \quad (8)$$

where Ksx and Ksy are coefficients represented by complex variables. Now, assuming that the signal (Xstg, Ystg) of the astigmatism corrector is changed individually by ΔXstg and ΔYstg, motions (parallax) ΔWix and ΔWiy of the observed image corresponding to each change are respectively represented by the following formulas (9) and (10), $$\Delta Wix=\Delta Xstg\cdot(Asx+Bx\cdot Ksx) \quad (9)$$

$$\Delta Wiy=\Delta Ystg\cdot(Asy+By\cdot Ksy) \quad (10)$$

where Asx and Asy are complex variables having values determined so as to correspond the axis deviation of the beam corresponding to the astigmatism correction. Ksx and Ksy represent axis alignment parameters (complex variables) controlled by the apparatus. Moreover, Bx and By are complex variables determined by the position and deflection sensitivity of the aligner the condition of the electron optical system and the like. Conventionally modulation signals of ΔXstg and ΔYstg were respectively added to the astigmatism corrector, and the operator recognized the movements (ΔWix, ΔWiy) at this time. Thus, the operator performed a manual adjustment for the parameters Ksx and Ksy to cancel the movements (ΔWix, ΔWiy).

Figure 4:
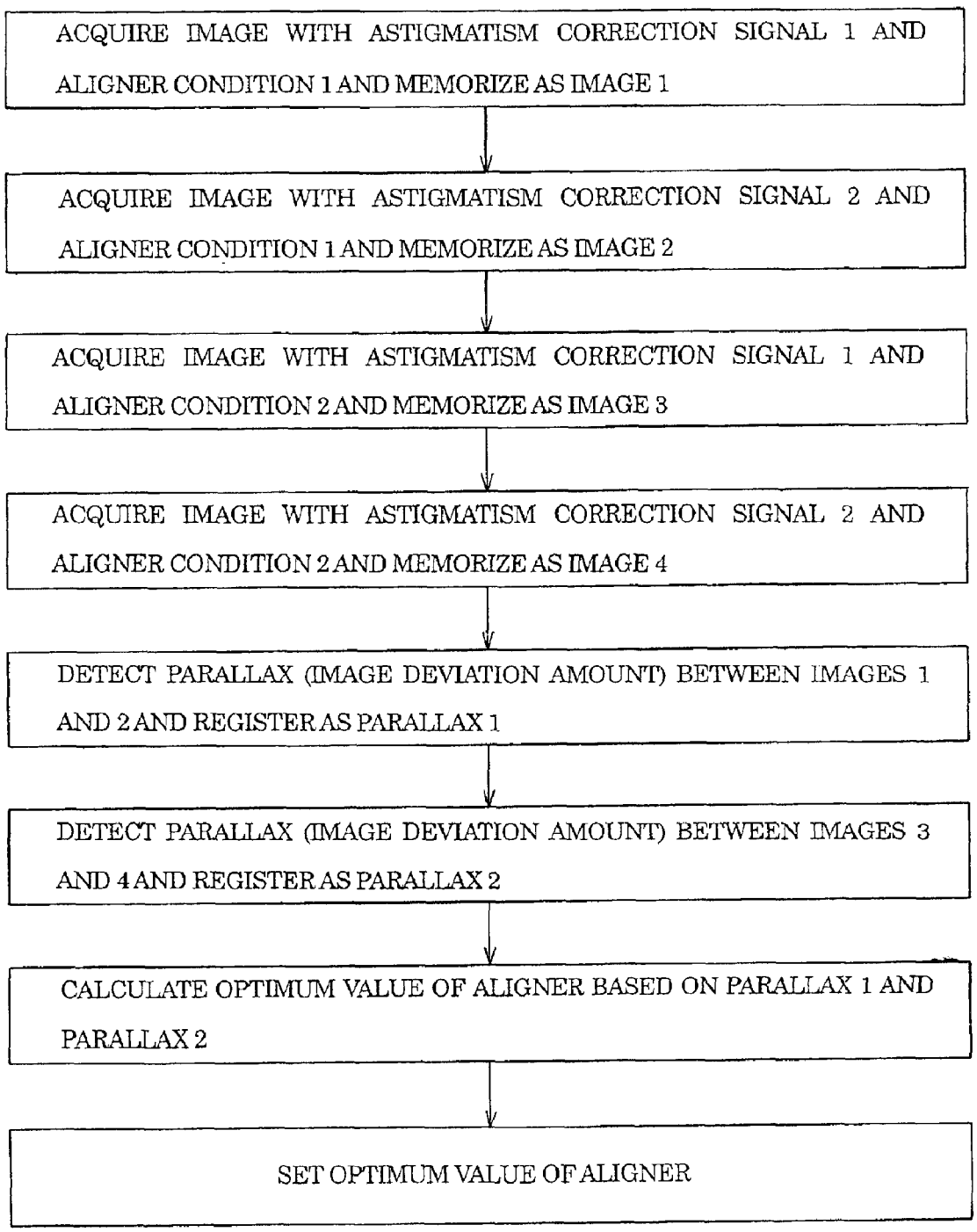
FIG. 4 is an outline of a processing flow for correcting an axis deviation relative to an astigmatism corrector.

This is the axis alignment operation for the astigmatism corrector. Specifically, the operation to align the axis to the astigmatism corrector corresponds to finding the coefficients Ksx and Ksy at which ΔWix and ΔWiy becomes zero irrespective of ΔXstg and ΔYstg in the formulas (9) and (10). Although ΔWix and ΔWiy should be zero ideally, a way to find the coefficients is not limited to the above, and the coefficients may be found under conditions that ΔW is made small so as to be close to zero. The form of the formulas (9) and (10) is entirely the same as that of the formula (4) shown in the above, and when the change of the current value (ΔI) of the objective lens is substituted for a signal change (ΔXstg, ΔYstg) of the astigmatism corrector, it is possible to find optimize control parameters (Ksx, Ksy)

for the aligner 53 by the parallax detection and the calculation processing. The processing flowchart for finding the optimum control parameters is shown in FIG. 4. Since the aligner for correcting the deviation of the field of view by the astigmatism corrector serves for correcting the position of the beam on the sample, the aligner must be disposed at a position where the position of the beam on the sample can be controlled.

The magnitude of the axis deviation relative to the astigmatism corrector can be quantized by the image deviation (parallax) when the changes ΔXstg and ΔYstg are added to the signal of the astigmatism corrector. For this reason, in this embodiment, when an operation such as a change of an acceleration voltage, a sample exchange and a change of a focus position, which may change a state of the optical axis, is performed similarly to the foregoing case the axis deviation relative to the objective lens, the parallax detection is performed, and it is possible to inform the operator of the state of the axis deviation by displaying it. The operator follows this displaying and can instruct the astigmatism corrector to execute the axis alignment processing by the input means displayed on the screen if necessary. The input means can adopt various styles in which, for example, exclusive icons displayed on a monitor are clicked by a mouse, or a processing is designated from a menu screen.

Figure 6:
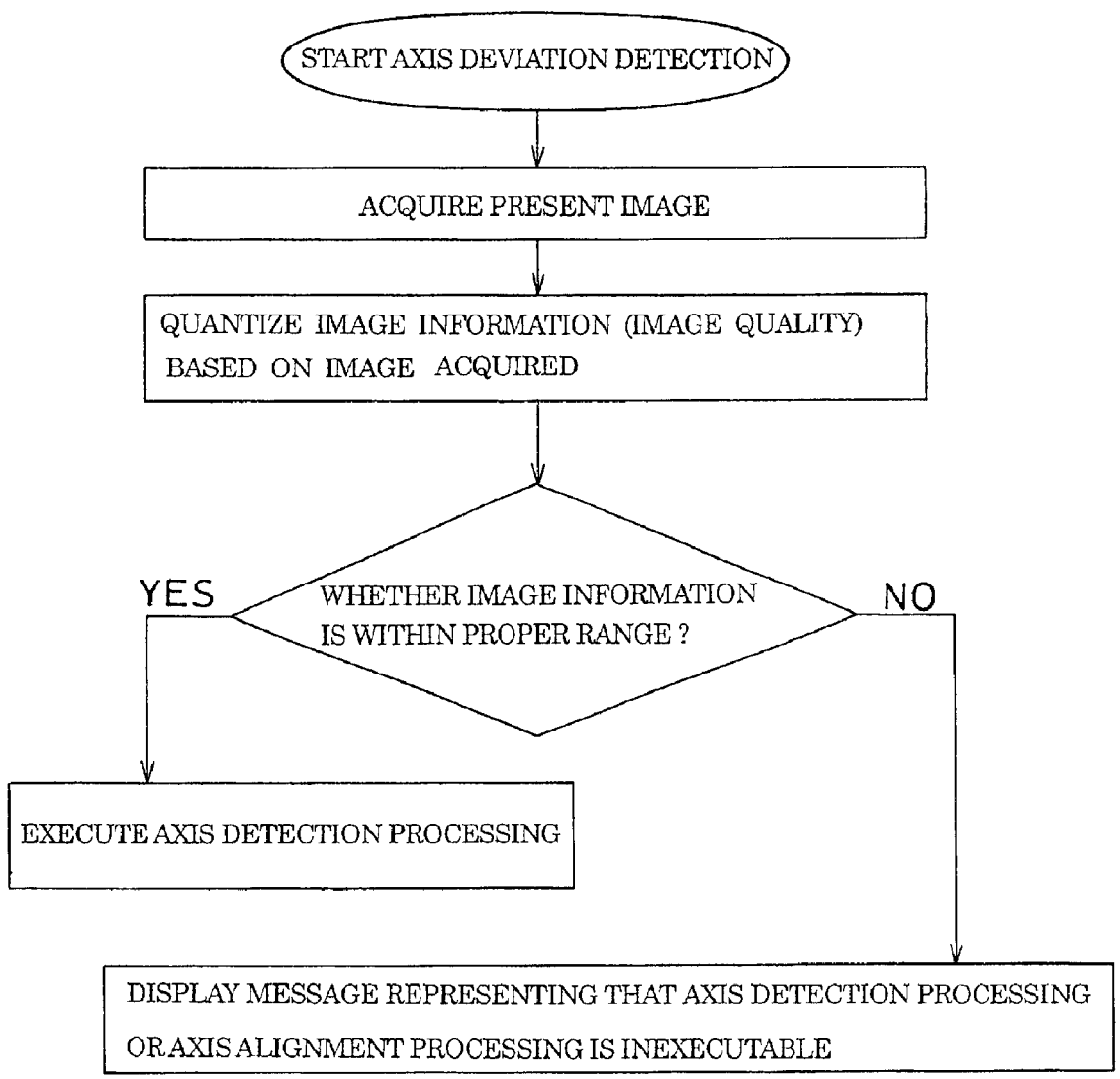
FIG. 6 is a drawing illustrating an example of an axis deviation detection processing to which an image quality decision processing is added.

In this embodiment of the present invention, it is possible to prevent an erroneous processing operation when the operator instructs the axis alignment processing erroneously in a state where the image is improper, that is, a state where the focus remarkably deviates, and a state of an image which includes almost no structural information. Descriptions for this function will be made by use of the processing flowchart of FIG. 6. When a processing for detecting the axis deviation or a start of a processing for the axis alignment is instructed, the CPU 40 fetches the present image thereinto and executes a quantization (image quality quantization) processing for the fetched image. The processing by the quantization means is executed for quantizing as to whether an image includes structural information necessary for a parallax detection. As an output of this processing, for example, the image is subjected to a Fourier transform, and, based on this result, a quantization value Fi calculated by the following formula (11) can be used.

$$Fi = \Sigma\Sigma[F(fx, fy) \cdot fx^n \cdot fy^n] \quad (11)$$

where F(fx, fy) represents a two-dimensional Fourier transform (FFT) of the image, and fx and fy represent a spatial frequency. By using a real number and an integer equal to one or more as an index number n, a proper quantization for the image quality is possible. Specifically, if the image includes no structural information, F(fx, fy) is very small value in a region where fx and fy are larger than zero. Accordingly, based on the calculation result of the formula (11), it is possible to decide whether the image quality includes proper structural information. In the case where this quantization value Fi is equal to a value previously determined or less or lower than this value, an alarm should be issued based on a decision that the quantization value Fi is not proper for an alignment signal calculation. This alarm may be a display as shown in FIG. 5 or sound.

(Embodiment 3)

Figure 7:
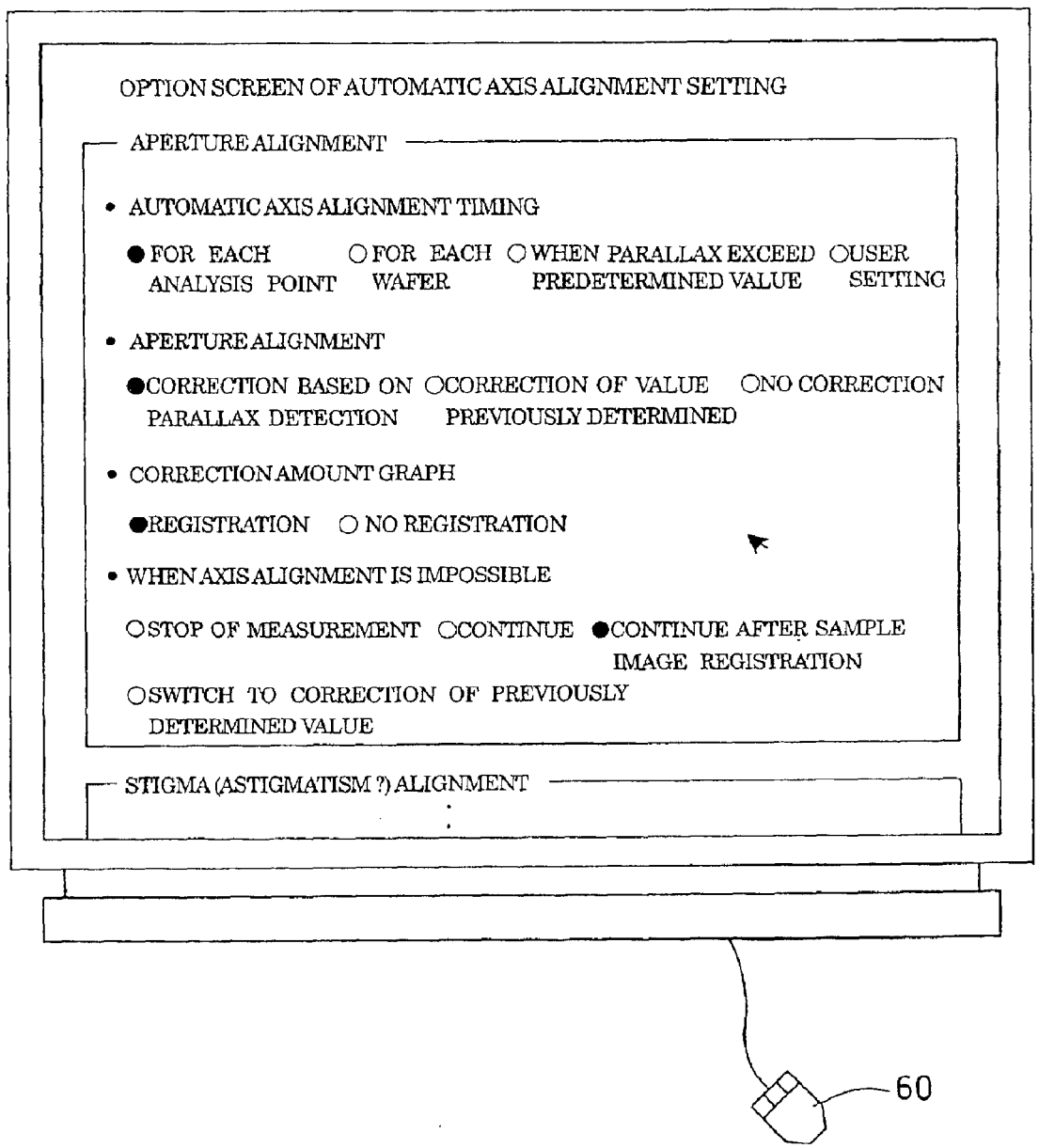
FIG. 7 is a drawing illustrating a setting screen for setting environments of an automatic axis deviation correction.

FIG. 7 is a drawing for explaining a third embodiment of the present invention, which shows a setting screen for setting environments for an automatic axis deviation correction displayed in an image display device. An operator of a scanning electron microscope sets the environments of the automatic axis alignment based on this screen. In the case of this embodiment, an example in which the environments are set by use of a pointing device 60 on the setting screen will be described. First, the operator decides whether an aperture alignment is executed automatically, and selects any one of "Correction Based On Parallax Detection", "Previously Determined Value Correction" and "No Correction". "Correction Based On Parallax Detection" is a mode in which the axis deviation correction is executed in the steps described in Embodiment 1. If this mode is selected, axis correction precision, which is stable for a long time regardless of a change of a primary electron beam due to the passage of time, can be acquired. "Previously Determined Value Correction" is a mode in which an existing condition of an objective lens and an axis deviation caused for each of distances between a sample and the objective lens, which are a plurality of optical conditions such as a working distance, are previously registered in a memory (not shown), and an axis alignment is performed under the registered axis alignment condition when a predetermined optical condition is set. This mode should be selected, for example, when no change of the axis deviation depending on the passage of time occurs and when approximately the same axis deviation is recognized regardless of the change of the optical condition. Since in this setting the correction is performed based on the previously determined value, a detection of the axis alignment condition and a calculation time are not needed, and hence shortening of the processing time is possible. "No Correction" is a mode in which the axis alignment is not performed, and this mode should be selected under environment where the axis deviation does not occur.

As described above, if a preparation is made so as to be capable of selecting a plurality of correction modes by an environment setting screen, it is possible to select a proper correction condition based on the usage condition and the environment of the scanning electron microscope.

Next, the operator selects an automatic axis alignment timing. With regard to this selection, for example, when a frequency of occurrence of the axis deviation is high, "Every Analysis Point" is set in consideration for precision of the axis alignment, and the axis deviation correction is performed for each measurement point. When the axis deviation does not occur so frequently, "Every Wafer" is selected in consideration for throughput, and the axis deviation correction should be performed every time when a wafer to be measured by the scanning electron microscope is replaced with another. By providing such a choice of selections, it is possible to select a proper timing of the axis deviation correction based on the usage condition and the environment of the scanning electron microscope. Furthermore, when "When Parallax Exceed Predetermined Value" is selected, the parallax ΔWi for the objective lens current change amount ΔI is detected for each analysis point or each wafer. When the parallax ΔWi exceeds the predetermined value, "Correction Based On Parallax Detection" is performed. In addition, when "User Setting" is selected, the axis alignment is performed at an axis alignment timing separately registered in advance.

Figure 8:
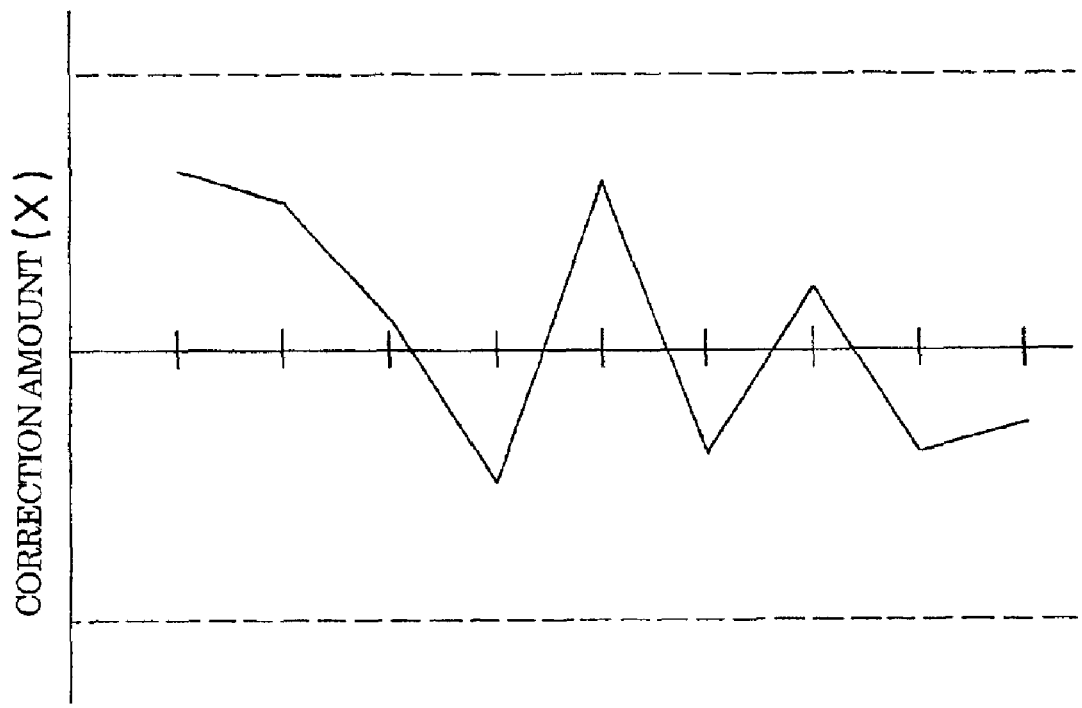
FIGS. 8(a) and 8(b) are drawings illustrating a displaying example of a correction amount graph.
Figure 8:
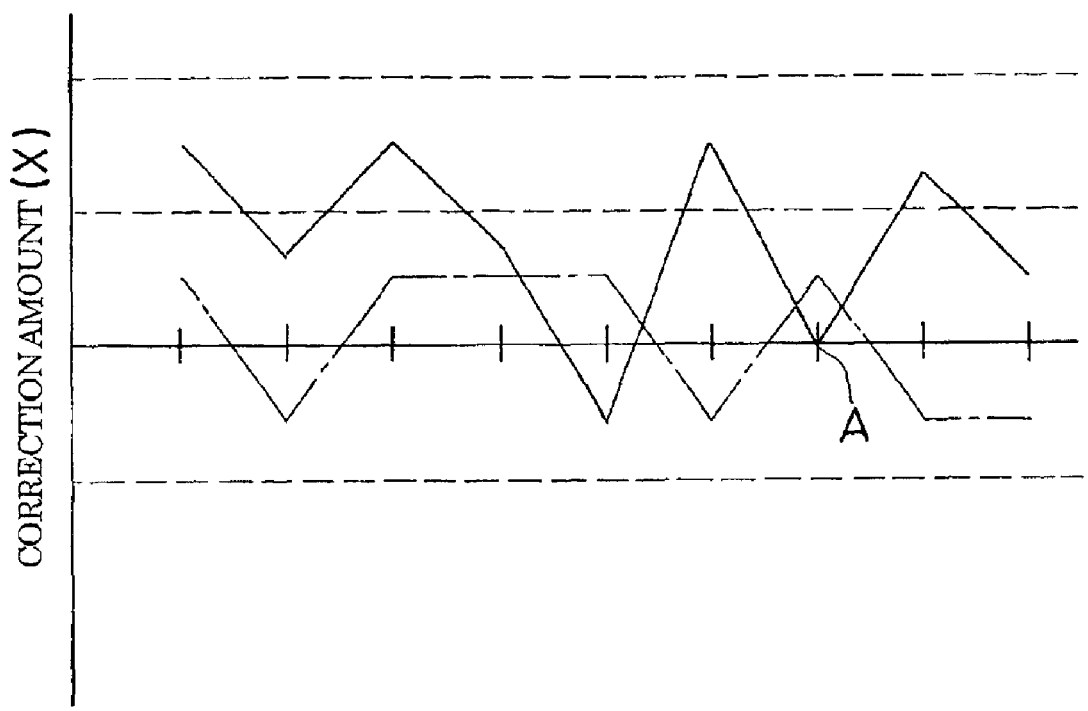

Next, the operator selects whether he/she should register a correction amount graph or not. The correction amount graph is displayed in the form as shown in FIG. 8(a) on the image display device. In the technology described in Embodiment 1, a coil current supplied to the astigmatism correction aligner 53 is calculated finally. A difference between the magnitude of the coil current and the magnitude of the non-corrected coil current represents how far the beam deviates from the optical axis, and it is possible to judge a transition of a degree of the axis deviation with a graph of the degree of the axis deviation made by plotting it. If this transition of the axis deviation shows approximately a certain value, the mode is switched to "Previously Determined Value Correction" formerly selected based on the judgment that a later state of the axis deviation is unchanged, whereby a detection time and a calculation time of the axis alignment condition, which are required for "Correction Based On Parallax Detection", can be deleted and thus throughput can be enhanced. Displaying of such a graph can allow the operator to make a judgment for a proper automatic axis alignment and to set a proper axis alignment condition.

The graph shown in FIG. 8(b) is an example in which measurement results for semiconductor pattern widths are displayed so as to be superimposed on the correction amount graph of FIG. 8(a). The measurement of the semiconductor pattern widths is performed by measuring the width of a line profile formed based on a detection amount of secondary electrons and reflected electrons, which are obtained by scanning an electron beam one-dimensionally or two-dimensionally on a semiconductor device on which a pattern to be measure measured is formed. The measurement results of the pattern to be measured obtained in the above described manner and errors of pattern dimensions based on design information are plotted so as to be superimposed on the correction amount graph shown in FIG. 8(a).

In FIG. 8(b), the symbol "A" indicates a point where the measurement was performed under the condition that "Correction Based On Parallax Detection" is not performed because the parallax ΔWi exceeds a certain determined range or because there is no structural information necessary for the parallax detection (in the case where the quantization value Fi described in Embodiment 2 is equal to a value or less or lower than this value). In order to make it possible to distinguish this portion from a portion where the correction amount is zero, this portion should be displayed in such a manner that this portion is distinguished from other portions by displaying this portion with a different color. In the following descriptions, when the parallax ΔWi exceeds a predetermine range, descriptions for the case where the measurement is executed without performing "Correction Based On Parallax Detection" will be made. However, the way of the measurement is not limited to this, and an alarm to urge the operator to perform the axis alignment or the like may be issued so that the operator stops the automatic measurement. Note that when the measurement is continued in spite of the fact that "Correction Based On Parallax Detection" is not performed, the obtained measurement value may be erroneous. In such a case, in order to confirm with eyes later whether the measurement was properly performed, at least one of the sample images obtained in the measurement, the line profile and the optical condition of the electron microscope should be memorized together with the measurement value. The operator can judge reliability of the measurement by checking these information against the obtained measurement results.

Next, when the parallax ΔWi exceeds a certain determined range or when the setting value Fi is equal to a certain value or less, or less than this certain value, the operator selects which processing he/she should perform. When the operator selects "Measurement Stop", the measurement that is being executed automatically and continuously falls in a stop state, and the electron beam is blanked by a blanking mechanism (not shown) so as not to be radiated onto the sample. Thus, a standby state is brought about. At this time, the message shown in FIG. 7 may be displayed on the image display screen. Among the modes, "Continue" represents a mode in which "Correction Based On Parallax Detection" is not performed but the measurement is performed continuously. "Continue After Sample Image Registration" is a mode in which the sample image and the like obtained without performance of "Correction Based On Parallax Detection" described above is registered together with the measurement results. "Switching To Correction Of Previously Determined Value" is effective such as when "Correction Based On Parallax Detection" cannot be performed and a state of the axis deviation is found out to some extent. In this mode, the axis alignment is performed based on the previously registered correction amount. Moreover, without performance of the measurement, skipping to a next measurement point may be done. As a matter of course, the environment setting screen described so far can be applied to the astigmatism alignment.

In order to decide whether the automatic axis alignment described in this embodiment is performed properly, at least four sample images served to perform "Correction Based On Parallax Detection" may be displayed on the image display screen in real time. Although the above descriptions were made for explaining the performance of the axis alignments for the objective lens and the astigmatism corrector, the axis alignment is not limited to the above, but the axis alignment is generally applicable to optical devices of the charged particle beam, for which the optical axis alignment must be performed by use of the alignment deflector. Moreover, the present invention can be applied to all of charged particle beam apparatuses which converge a charged particle beam by use of a convergence ion beam and an axis symmetry lens system. In addition, an electrostatic deflector may be employed as the aligner deflector.

(Embodiment 4)

Next, in an apparatus especially desired to be operated automatically, to which many samples are continuously introduced, which includes a scanning electron microscope for measuring dimensions of a pattern width formed on a semiconductor wafer and a contact hole and a scanning electron microscope which checks existence of defects on the semiconductor wafer and reviews the detected defects, a preferred embodiment for performing an axis alignment for an optical device such as an objective lens and an astigmatism corrector for aligning an electron beam, which are incorporated in each of the above scanning electron microscopes, will be made.

Figure 9:
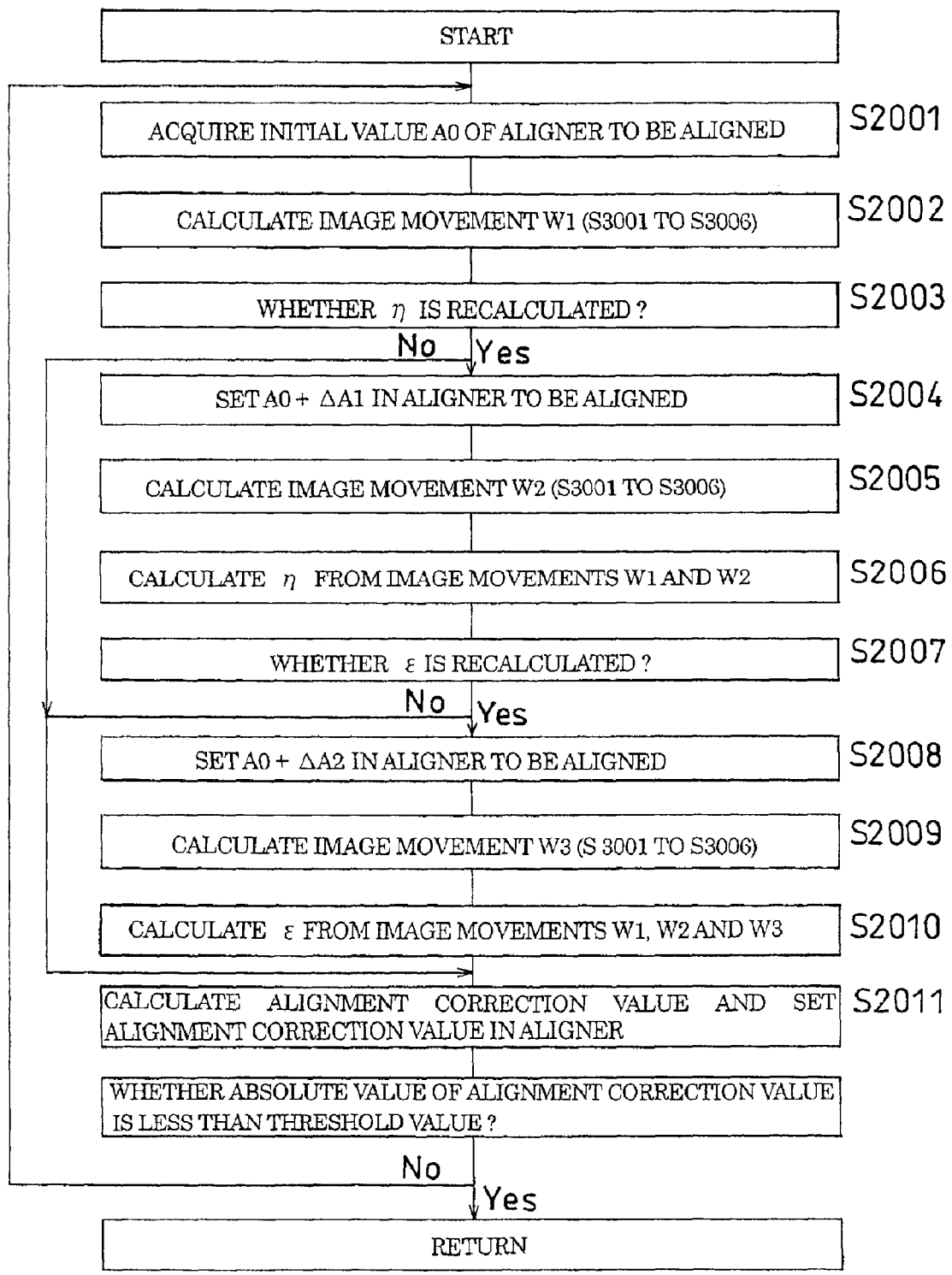
FIG. 9 is an outline of a processing flow for correcting an axis deviation.
Figure 10:
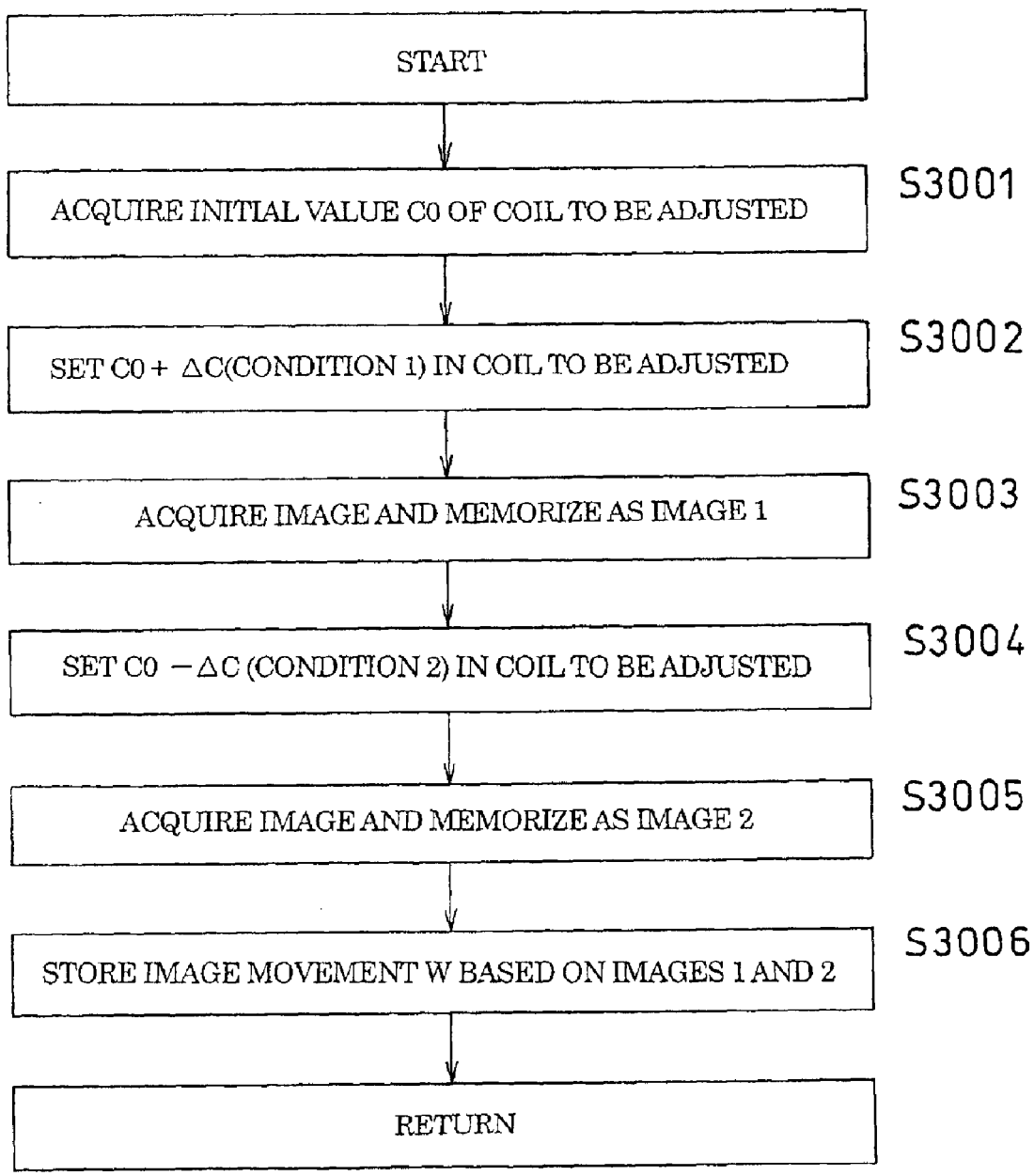
FIG. 10 is a processing flow for detecting an image deviation.

FIGS. 9 and 10 are flowcharts for explaining the embodiment, and the flowcharts are executed according to a program previously stored in a storage device 41 and a command input from the input device 42. The flowchart shown in FIG. 9 differs from the flowcharts shown in FIGS. 2 and 4 in that while the technique of the axis alignment is unchanged to the flowcharts shown in FIGS. 2 and 4, the technique of the axis alignment changes in accordance with the states of affairs in the flowchart shown in FIG. 9.

In Step 2001, an initial value A0 (for example, the present condition 1) of the adjustment aligner such as the objective lens aligner 51 and the astigmatism correction aligner 53 is acquired and stored in the computer 40. In Step 2002, an image movement W1 which means parallax in the embodiments 1 to 3 is calculated. The calculation of an amount of the image movement is executed in Steps 3001 to 3006 to be described later. In Step 2003, it is decided whether η is recalculated by a flag previously given. η herein is an unknown to be found in this embodiment as described later. When the recalculation is performed, Steps 2004 to 2006 are executed. When the recalculation is not performed, the image movement W2 is set to zero, and a previously given value is set to η. Thereafter, Step 2011 is executed. In Step 2004, a condition (condition 2), in which a deviation amount ΔA1 is changed relative to the initial value A0 of the aligner stored in the computer 40, is set in the aligner. In Step 2005, the image movement W2 is calculated according to the processing flowchart of Steps 3001 to 3006.

Next, in Step 2006, η is calculated from the formula (12) by use of the image movement W1 and the image movement W2 stored in the computer 40.

$$\eta = -1/(W2-W1) \quad (12)$$

In Step 2007, it is decided whether ε is recalculated by a flag previously given. Herein, ε is a constant inherent to the apparatus, which is to be found in this embodiment as described later. When the recalculation is performed, Steps 2008 to 2010 are executed. When the recalculation is not performed, the image movement W3 is set to zero, and a previously given value is set for ε. Thereafter, Step 2011 is executed. In Step 2008, a condition (condition 3 different from conditions 1 and 2 described above) in which a deviation amount ΔA2 is changed relative to the initial value A0 of the aligner stored in the computer 40 is set in the aligner. In Step 2009, the image movement W3 is calculated according to the processing flowchart of Steps 3001 to 3006.

In Step 2010, ε is calculated from the formula (13) by use of the image movements W1, W2 and W3 stored in the computer 40.

$$\epsilon = (W3-W2)/(W2-W1) \quad (13)$$

In Step 2011, alignment correction values X and Y are calculated by use of the image movement W1, η, ε, and |ΔA1| according to the formula (14), and the alignment correction values X and Y are set in the aligner.

$$X + j\epsilon \cdot Y = |\Delta A1| \cdot \eta \cdot W1 \quad (14)$$

In Step 2012, when an absolute value (X·X+Y·Y) of the alignment correction value, that is, an actual axis deviation amount, is equal to a threshold previously determined or larger than the threshold, a retrial processing (Steps 2001 to 2012) is performed. The retrial processing compensates deviation correction precision when an image is taken in and the deviation detection is performed in a state where the initial alignment significantly deviates. By repeating the corrections plural times in the above described manner, the deviation can be corrected with higher precision.

Next, a calculation step for the image movement will be described by use of FIG. 10. In Step 3001, an initial value (for example, the present condition) C0 of the coil to be adjusted (the objective lens 7 or the astigmatism corrector 52) is acquired and stored in the computer 40. In Step 3002, a condition, in which as the condition 1 a value ΔC previously determined is changed relative to the initial value C0 of the coil to be adjusted, is set for this coil. In Step 3003, the image 1 is acquired in the condition 1 and stored in the image memory 25. In Step 3004, a condition, in which as the condition 2 a value −ΔC previously determined is changed relative to the initial value C0 of the coil to be adjusted, is set for this coil.

In Step 3006, the image movement W is calculated in an image processing device 27 based on the images 1 and 2 and stored in the computer 40. The image movement W is a vector of (x, y) and a deviation amount of the images 1 and 2. With respect to the calculation for the deviation amount, a position which is most similar to the image 2 using a partial image of the image 1 as a template is calculated by use of the following formula (15).

$$r(X,Y) = \frac{\left[N\sum_{i,j} Pi,jMi,j - \left(\sum_{i,j} Pi,j\right)\left(\sum_{i,j} Mi,j\right)\right]}{\sqrt{\left[N\sum_{i,j} P^2i,j - \left(\sum_{i,j} Pi,j\right)^2\right]\left[N\sum_{i,j} M^2i,j - \left(\sum_{i,j} Mi,j\right)^2\right]}} \quad (15)$$

r(X, Y) is a correlation value in (X, Y), and Pij is a density value at a point (X+i, Y+j) of the image 1 corresponding to the image 2. Mij is a density value in a point (X+$_{i+1}$, Y+$_{j+1}$), and N is the number of pixels of a pattern mask. The deviation value to be found is equal to a value obtained by subtracting (X, Y) from the position of the partial image of the image 1. This method shows a high degree of freedom because any pattern may be used in this method.

As another method for calculating the image movement, the following is conceived. When an image for calculating the image movement includes a specific shape, for example, when a holder pattern is included in the image, the position of the pattern in each of the images 1 and 2 is detected according to the following method, and the deviation amount can be detected.

First, the image 1 is subjected to a differentiation by a differentiation filter, and a threshold is set so that an edge is left. Thus, a binary screen is prepared. This binary screen undergoes a segment processing, and only an edge forming a pattern is extracted. The center of gravity (x1, y1) of the pattern is calculated based on the edge information extracted. The same processing is performed for the image 2, and the center of gravity (x2, y2) of the pattern is calculated. The deviation amount to be found becomes equal to W(x2−x1, y2−y1). Even if a pattern having a circular shape originally is detected to be elliptical by changing an electron optical condition, this technique shows a merit that this technique is tough against ha change in shape of the pattern because the position of the center of gravity of the pattern hardly changes.

The processing flowchart described herein is the same as those for the objective lens aligner 51 and the astigmatism correction aligner 53 (X-direction, Y-direction) except for control values. Moreover, ε is a constant inherent to an apparatus disposed in the X and Y-directions, which concerns a sensitivity difference and an orthogonal deviation. Accordingly, values which were found periodically and at the time of starting-up of the apparatus are previously stored in the storage device 41. The stored values are previously read into the computer 40 before the processing flowchart is executed, whereby Steps 2008 to 2010 can be omitted. When the axis alignment is performed in a relatively short cycle without a change of the electron optical condition, the value calculated for η last time is previously stored in the computer 40, and the calculated value can be used as η.

As described above, this embodiment has a feature in that six pieces of images obtained by changing the optical condition are used, and the mode in which the predetermined variables such as ε and η are recalculated (hereinafter referred to as a three-point measurement mode), the mode in which only η is recalculated based on four pieces of images obtained by changing the optical condition (hereinafter referred to as a two-point measurement mode) and the mode in which ε and η are not recalculated (hereinafter referred to as a one-point measurement mode) are alternatively used according to the sate of affairs. While the three-point measurement mode is capable of obtaining high axis alignment precision, two pieces of images will do in the one-point measurement mode, and a high processing speed can be achieved. Since each of modes shows an advantage inherent to them respectively, for example, it is desirable to selectively use each mode as described below.

The three-point measurement mode is performed, for example, at the time of starting up a semiconductor testing apparatus, and ε is previously calculated at that time. The two-point measurement mode is executed once a day or at the time of a change of a recipie for changing a condition of the semiconductor testing apparatus significantly, and ε is used after reading out it from the storage device 41. The one-point measurement mode is executed for each measurement point of the semiconductor wafer to be checked, and ε and η are executed after reading out them from the storage device 41 and the computer 40, respectively. Needless to say, the above descriptions were made for a mere example, and, as a matter of course, various modifications can be employed according to sorts of the apparatus and measurement conditions.

Note that since the deviation amount ΔA uses the sample image for detecting the image movement, the following two conditions must be satisfied. (1) The deviation amount must be made much to a certain extent so that the movement of the sample pattern can be recognized. (2) The deviation amount must be made less to a certain extent so that the sample pattern is previously out of the screen. The conditions (1) and (2) can be determined if a geometrical position of the sample pattern is found. Specifically, the deviation amount ΔA is determined based on the geometrical arrangement of the sample pattern and an observation magnification. This deviation amount ΔA may be determined by providing an automatic sequence so as to be less when the magnification is high and much when the magnification is low. Alternatively, the deviation amount ΔA may be input automatically from the input device 42.

According to this embodiment of the present invention, in the apparatus which performs the axis alignment for the charged particle optical system based on the obtained sample image, the calculation means as described above and the selection means for selecting one of the plurality of axis alignment methods (the plurality of calculation methods) are provided, whereby it is possible to realize compatibility between the high axis alignment precision and the high processing speed. Such technical effects are particularly effective for the semiconductor testing apparatus to which the semiconductor wafer having the plurality of measurement points is continuously introduced, in which there is a possibility of the change of the optical condition with the passage of time because of the continuous automatic operation, and in which the optical condition changes by changing the recipie. In this technology, a proper axis alignment method can be assigned according to demand.

The parameter η adopted in this embodiment represents in what way the image movement amount (including the direction) changes when the alignment coil is operated and is one including the alignment deflection sensitivity. Note that the parameter η changes depending on the operation condition of the electron optical system as well as depending on the simple alignment deflection sensitivity.

In this embodiment, the basic formula (1) described in the foregoing embodiment is transformed as described below, and the parameter in the formula (1) is replaced with the parameter η. The tilt of the electron beam orbit in the alignment coil described in the former embodiment includes two tilts: one results from the axis deviation (WAL0') and the other results from the deflection (WAL1') owing to the present setting value of the alignment coil. Moreover, assuming that a tilt of a beam relative to a changed amount (setting changing value) of the present setting value of the alignment coil be WAL2', the following formula (16) is given.

$$WAL' = WAL0' + WAL1' + WAL2' \quad (16)$$

Because a parameter necessary for the control is WAL2' in the formula (16), the formula (1) is represented by the following formula (17) when the terms other than WAL2' are assumed to be a constant.

$$\Delta W = \Delta I \cdot K \cdot (A1 + B1 \cdot WAL2') \quad (17)$$

Here, an image movement amount given by ΔI·K·A1 corresponds to the image movement amount caused under the condition of the present setting value of the alignment.

On the other hand, a relation between a DAC value (X, Y) of the alignment coil and the tilt WAL2' of the beam can be written by the following formula (18), $$WAL2' = k \cdot (X + j\epsilon \cdot Y) \quad (18)$$

where k is a coefficient representing the sensitivity of the alignment coil, and ε represents a complex relative sensitivity of Y relative to X (absolute value of ε: sensitivity ratio, arg(ε): orthogonal deviation. The formula (18) is substituted for the formula (17), and meaningless coefficients are collected to be represented. The image movement amount ΔW when the objective lens current is changed can be written by the following formula (19).

$$\Delta W = A2 + B2 \cdot (X + j\epsilon Y) \quad (19)$$

Since a condition of a central axis of current is that ΔW is equal to zero, an alignment value satisfying this condition is calculated by the following formula (20).

$$X + j\epsilon Y = -A2/B2 \quad (20)$$

Accordingly, if A2 and B2 are deduced from the image movement amount, the alignment control value (X, Y) by which the center axis of current is obtained can be calculated. To calculate A2 and B2, the image movement amount W1 when X=Y=0 in the formula (17) and the image movement amount W2 when X=X1≠0 and Y=0 in the formula (17) are detected. Specifically the following formulas (21) and (22) are obtained.

$$W1 = A2 \quad (21)$$

$$W2 = A2 + B2X1 \quad (22)$$

From the formulas (21) and (22), the formula (20) is written by the following formula (23).

$$X + j\epsilon Y = -X1 \cdot W1/(W2 - W1) \quad (23)$$

In the embodiment, the term of −1/(W2−W1) in the formula (23) is defined as η. When η is rewritten, the following formula (24) is obtained.

$$\eta = -1/(W2 - W1) = -1/B2 \quad (24)$$

(Embodiment 5)

Figure 11:
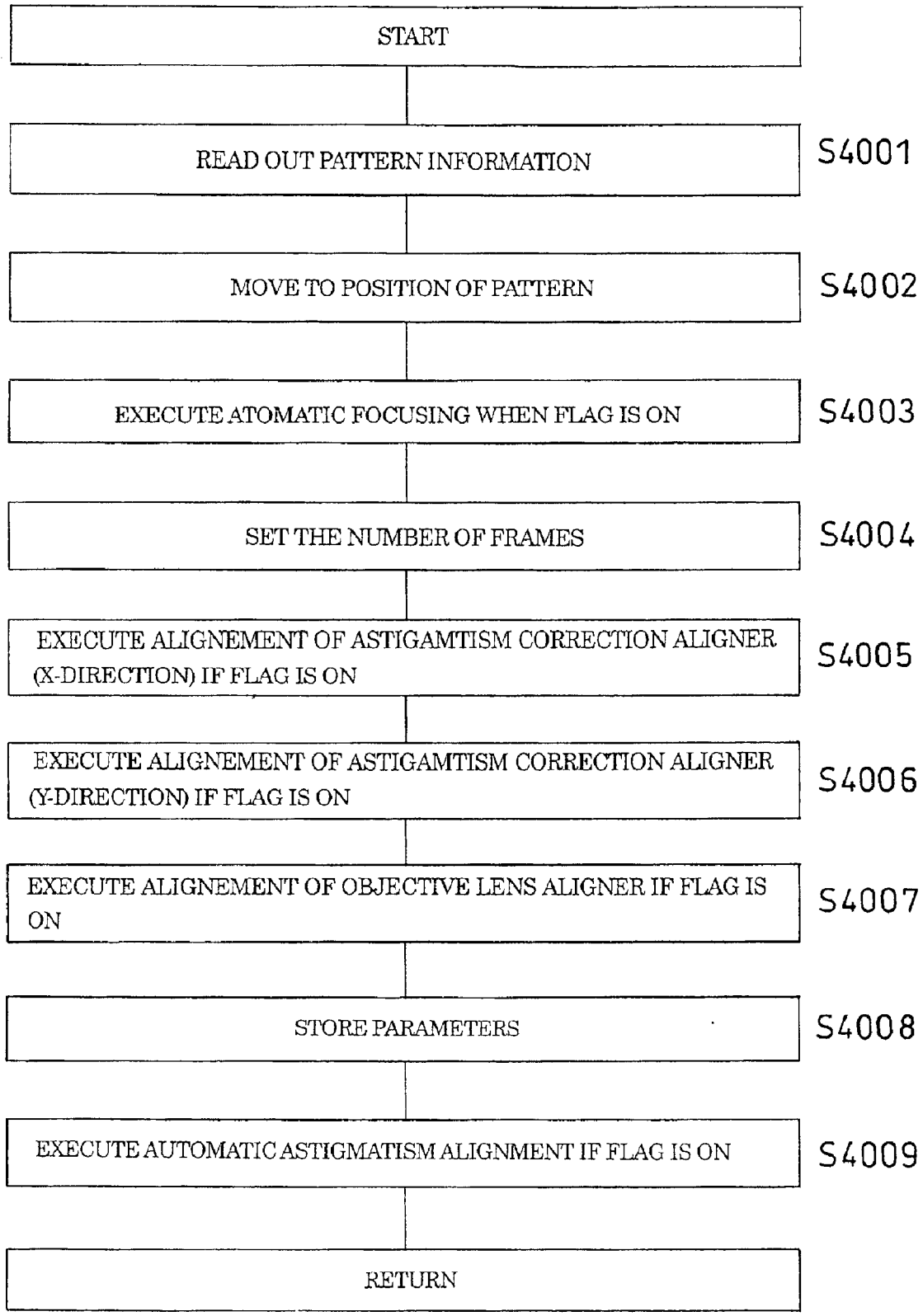
FIG. 11 is an outline of a processing flow at the time when an automatic operation is executed.

FIG. 11 is a flowchart for explaining an embodiment concerning a full-automatic axis alignment. The full-automatic axis alignment in this embodiment is to perform automatic controls including a series of the following operations. Specifically, a stage 15 is driven at timings previously determined, and a pattern 16 for alignment is positioned just below an electron beam, followed by setting a magnification and an image pickup based on pattern information. Thereafter, for example, an astigmatism correction aligner 53 is adjusted as to its X-direction, and then the astigmatism correction aligner 53 is adjusted as to its Y-direction, followed by adjusting an objective lens aligner 51. Note that, an adjustment order of the astigmatism correction aligner 53 and the objective lens aligner 51 is determined depending on arrangements of lenses in an electron optical system. In the case of the electron optical system illustrated in FIG. 1, when an axis alignment is performed by the astigmatism correction aligner 53 after an alignment is performed by the objective lens aligner 51, an optical axis of the electron optical system sometimes deviates relative to the objective lens again. Accordingly, it is desirable to begin the alignment at first with an optical device positioned closer to a negative electrode. In the case of an electron optical system in which lenses are arranged in order of the objective lens and the astigmatism corrector when viewed from the negative electrode, the alignment should be performed in order of the objective lens aligner and the astigmatism correction aligner.

In the descriptions of this embodiment, though an alignment pattern is provided separately from the sample, this embodiment is not limited to this, and the axis alignment may be performed by use of a specific pattern on the sample 10 such as a semiconductor wafer, which is an object to be observed.

Figure 12:
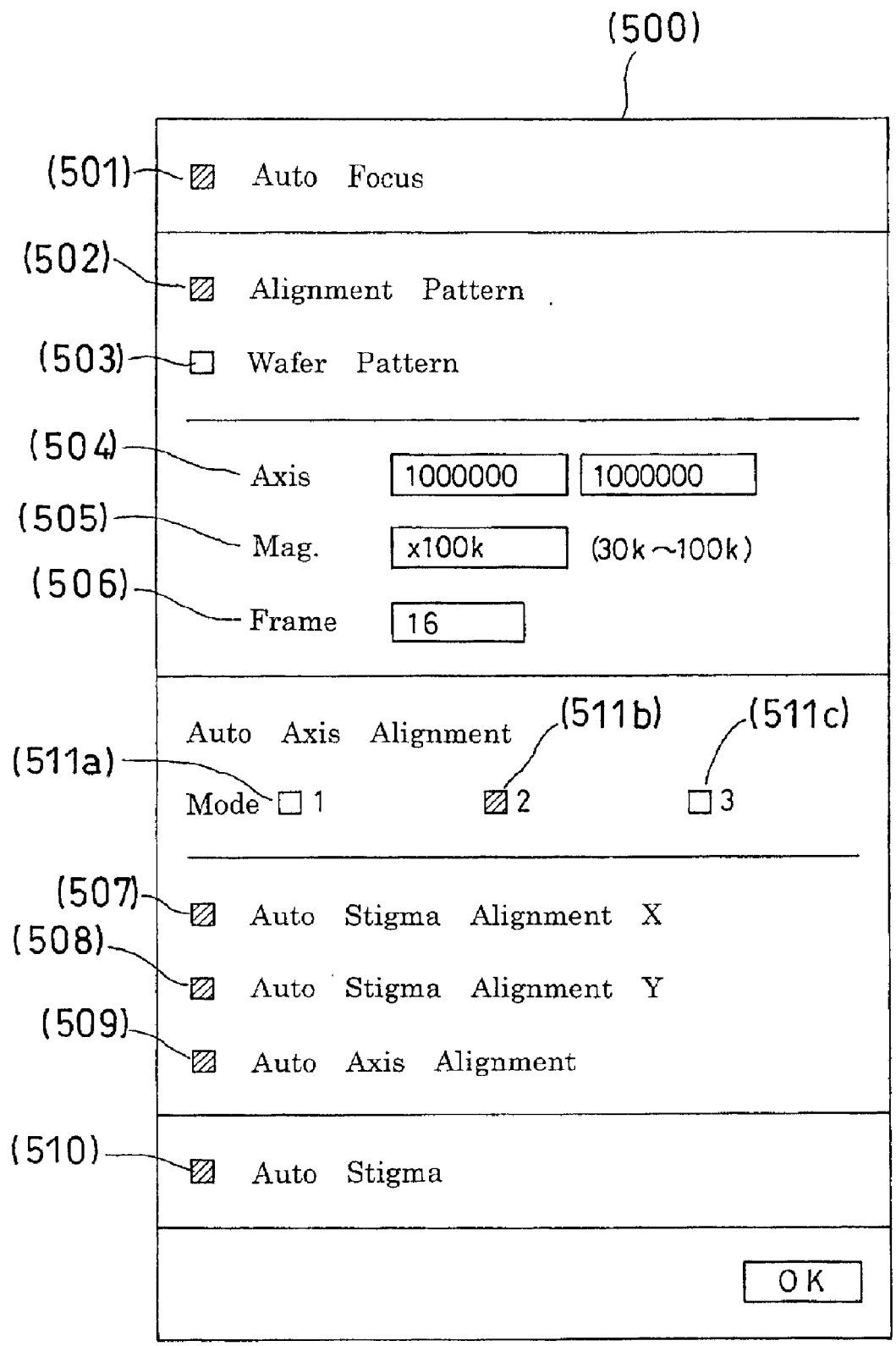
FIG. 12 is a drawing illustrating a setting screen for setting environments of an automatic axis deviation correction at the time when the automatic operation is executed.

Details of the processing flowchart of the full-automatic axis alignment will be described by use of FIG. 11 and an automatic axis alignment condition setting screen 500 illustrated in FIG. 12. FIG. 12 is displayed in the image display device 26 as a screen for setting one condition of the recipie file in which conditions of the automatic operation are registered. The user sets the automatic axis alignment condition in this screen and begins the automatic operation. Descriptions for the processing flowchart of the full-automatic axis alignment during the execution of the automatic operation will be described below.

In Step 4001 of FIG. 11, pattern information previously registered in the storage device 41 is read out, and a deviation amount is calculated based on a magnification. Moreover, based on the measurement mode described in the former embodiment, $\epsilon$ and $\eta$ are initialized if necessary. With respect to the pattern information used for the axis alignment, an alignment pattern flag 502 or a wafer pattern flag 503 is selected, whereby it is decided which one of the alignment pattern 16 on the stage and the pattern on the wafer is used. When the wafer pattern flag 503 is selected, stage coordinates of the pattern, a sample image acquisition magnification and the number of frames when the sample image is acquired are input from numerical value input windows 504, 505 and 506, respectively. When the alignment pattern flag 502 is selected, the stage coordinates, the magnification and the number of the frames, which are previously stored in the storage device 41, are set to the numerical value input windows, respectively. Note that, the number of the frames set in Step 4001 means the number of times of totalization for the scanning images to form the image of the pattern. In this embodiment, one pattern is obtained by totalizing sixteen pieces of sample images.

In Step 4002, the stage coordinates 504 are fetched out from the pattern information and then moved to the pattern position. When the alignment pattern flag 502 on the stage is selected, the stage is moved so that the axis alignment pattern 16 is positioned just below the electron beam. When the stage is moved, a value of current supplied from a scanning coil control power source 24 to the scanning coil 9 is set in accordance with the magnification input from the numerical value input window 505.

In Step 4003, a judgment for ON/OFF of an automatic focusing execution flag 501 is performed, and an automatic focusing is executed when the automatic focusing execution flag 501 is decided to be ON. In Step 4004, images of the number of frames input from the numerical value input window 506 are totaled, and the sample image is formed. In Step 4005, if an instruction to render an astigmatism correction aligner (X-direction) adjustment flag 507 ON is issued thereto, an adjustment of the astigmatism correction aligner (X-direction) is executed (Steps 2001 to 2012, Steps 3001 to 3006). In Step 4006, if an instruction to render an astigmatism correction aligner (Y-direction) adjustment flag 508 ON is issued thereto, an adjustment of the astigmatism correction aligner (Y-direction) is executed (Steps 2001 to 2012, Steps 3001 to 3006). In this adjustment, if a detection of the deviation amount is failed and the automatic focusing execution flag 501 is OFF, the detection of the deviation amount is tried once more after the focusing is executed.

In Step 4007, if an objective lens aligner adjustment flag 509 is ON, an adjustment of the objective lens aligner is executed (Steps 2001 to 2012, Steps 3001 to 3006). In Step 4008, when a flag 511a for the three-point measurement mode is selected, $\epsilon$ is stored in the storage device 41, and $\eta$ is stored in the computer 40. When a flag 511b for the two-point measurement mode or a flag 511c for one-point measurement mode is selected, $\eta$ is stored in the computer 40.

In this embodiment, though each of the measurement modes is selected by the flag previously determined, depending on a state of the image movement W1 calculated in Step 2002, for example, it may be decided by which mode the axis alignment is executed. For example, when the image movement W1 is large, the calculation based on many images is executed. The mode selection may be performed based on other information obtained not only by the image movement but also by comparison of two images. The selection of the measurement mode may be performed not only by an instruction of the operator but also by an automatic operation. Specifically, selection means for selecting the calculation method of the present invention may be previously set by the operator as described in the former embodiment. In addition, the selection means may function to automatically change the calculation method for calculating the deviation amount based on an evaluation of the image. In Step 4009, when a flag 510 for an automatic astigmatism alignment is ON, the automatic astigmatism alignment is performed.

When the automatic axis alignment is executed during the automatic operation, the automatic axis alignment is executed while usually rendering all of the flags 501, 507, 508, 509 and 510 ON. When the sample moves a predetermined pattern position, a height of the sample deviates in some cases from a focus position that has been adjusted before the movement. If the axis alignment is performed in the state where the height of the sample deviates from the position of the focus, the image deviation is detected with a pattern in a blurred image. Accordingly, axis alignment precision becomes lower. This problem can be solved by detecting the image deviation after the auto focusing is performed like this embodiment.

Moreover, with respect to the three axis alignments for the astigmatism aligners (X and Y-directions) and the objective lens aligner, decision as to which aligner makes a deviation is originally difficult as long as an operator is skilful.

Therefore, even when the axis alignment is performed manually, the axis alignments for all of the aligners are performed in almost all of the cases. According to the embodiment of the present invention, since the control so as to automatically perform the optical alignment in the most suitable order, that is, in order of ① the focus adjustment (auto focusing), ② the axis alignment for the astigmatism corrector (the axis alignment by the first alignment deflector), ③ the axis alignment for the objective lens (the axis alignment by the second alignment deflector), and ④ the astigmatism correction, the axis alignment can be executed with high precision and with high throughput.

As shown in FIG. 12, if setting items of the recipe is previously arranged in the actual alignment order of the optical system, it is possible to set the recipe while imaging an actual alignment performed in the electron optical system. Accordingly, there is a merit that setting is easy.

When the images used in each measurement mode described in the former embodiments and this embodiment is displayed on the image display device 26 in real time or after the image is once memorized in the image memory 25, it is possible to confirm by a visual inspection whether the axis alignment is correctly performed. For example, when the axis alignment is performed in a state where the focus is apparently defocused, a blurred image which is defocused is displayed on the image display device 26. Accordingly, the operator looks at this state, and can judge a reliability of the axis alignment processing.

(Embodiment 6)

Figure 13:
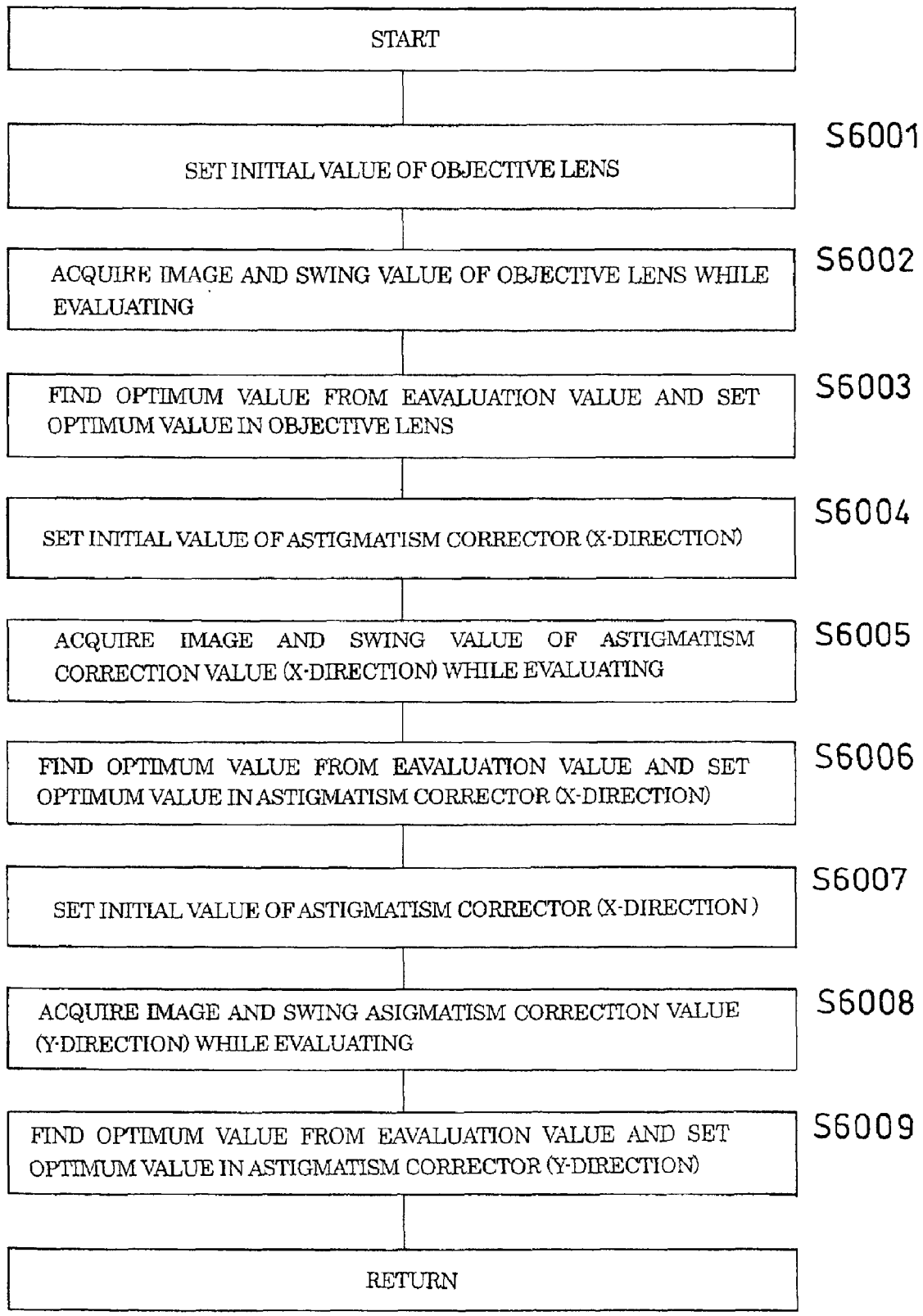
FIG. 13 is an outline of a processing flow of an automatic astigmatism alignment.

FIG. 13 is a flowchart for explaining a sixth embodiment of the present invention, which is an outline of the processing flowchart of an automatic astigmatism alignment after executing an automatic axis alignment. The processing is divided into three groups of steps (first step: Steps 6001 to 6003, second step: Steps 6004 to 6006, and third step: Steps 6007 to 6009). In the first step, a correct focus position of an objective lens is set. In the second step, the optimum value of an astigmatism corrector (X-direction) is set. In the third step, the optimum value of an astigmatism corrector (Y-direction) is set.

In Step 6001, an initial value R0 of a control value of the objective lens is determined by the present value R and a decided width ΔR. The initial value is obtained by R0=R−ΔR/2. In Step 6002, an image is fetched in while continuously increasing the control value of the objective lens by a width dR, which is previously determined, from the initial value R0. The width dR is obtained by dR=ΔR/N, where N is the number of evaluation points. The fetched-in image is transferred to an image processing device 27, and an evaluation value is calculated. With respect to the evaluation value, processings for obtaining a signal amount for four directions of 0°, 90°, 45° and 135° (for example, a total sum of differentiation images) are executed in a range from R0 to R0+ΔR.

In Step 6003, based on the evaluation value calculated at N points respectively in each of the four directions, an average of four control values for obtaining the control value of the objective lens, which are biggest in each direction, is set in the objective lens as the optimum value. In Step 6004, the initial value S0 of the control value of the astigmatism corrector (X-direction) is determined by the present value S and the width ΔS previously determined. The initial value is obtained by S0=S−ΔS/2. In Step 6005, the image is fetched in while increasing the control value from the initial value S0 thereof by the width dS. The width dS is obtained by S=ΔS/N, and N is the number of evaluation points. The fetched image is transferred to the image processing device 27, and the evaluation value is calculated. The evaluation value obtains a signal amount of the whole of the image, for example, a total sum of differentiation images. The above described processings are executed from S0 to S0+ΔS.

In Step 6006, among the evaluation values obtained by calculating for N points, the control value at which the evaluation value is maximum is set in the astigmatism corrector (X-direction) as the optimum value. In Steps 6007 to 6009, as to the astigmatism corrector (Y-direction), the same processings as Steps 6004 to 6006 are executed.

According to this system, it is possible to detect the correct focus position for the image including the astigmatism in the first step, and the automatic astigmatism alignment can be executed by the image in which the correct focus position is set. On the contrary, when the first step is executed after the second and third steps, the astigmatism alignment is executed by the image which does not exist in the correct focus position, and it is difficult to obtain the optimum astigmatism correction value.

According to the present invention, it is possible to perform the axis alignment with high precision regardless of the optical condition of the charged particle beam apparatus.

What is claimed is:

1. A charged particle beam alignment method which performs an axis alignment for a lens and uses a charged particle beam apparatus having a lens for converging a charged particle beam emitted from a charged particle source and forming a sample image by detecting secondary charged particles emitted from a sample by radiating the charged particle beam onto the sample converged by the lens, the method comprising the steps of:

changing a convergence condition of an objective lens to two states when a deflection condition of an alignment deflector is rendered to a first state;

detecting a first two dimensional deviation between first and second sample images obtained when the deflection condition of said alignment detector is rendered to the first state;

changing the convergence condition of said objective lens to at least two states when the deflection condition of said alignment deflector is rendered to a second state;

detecting a second two dimensional deviation between third and fourth sample images obtained when the deflection condition of said alignment detector is rendered to the second state;

calculating an unknown changing depending on a condition of said charged particle beam optical apparatus by applying information of the first and second two dimensional deviations to an equation indicating the relation of an alignment condition and deviation of the sample images; and obtaining the alignment condition based on the calculated unknown and a condition in which an image deviation becomes small when the convergence condition of the objective lens varies.

2. A charged particle beam alignment method which performs an axis alignment for an astigmatism corrector by an alignment deflector and uses a charged particle beam apparatus having an astigmatism corrector for performing an astigmatism correction of the charged particle beam emitted from a charged particle source and forming a sample image by detecting secondary charged particles emitted from a sample by radiating said charged particle beam corrected by said astigmatism corrector onto the sample, the method comprising the steps of:

changing a correction condition of said astigmatism corrector to two states when a deflection condition of said alignment deflector is rendered to a first state;

detecting a first two dimensional deviation between first and second sample images obtained when the deflection condition of said alignment detector is rendered to the first state;

changing the correction condition of said astigmatism corrector to at least two states when the deflection condition of said alignment deflector is rendered to a second state;

detecting a second two dimensional deviation between third and fourth sample images obtained when the deflection condition of said alignment deflector is rendered to the second state;

calculating an unknown changing depending on a condition of said charged particle beam by applying information of the first and second two dimensional deviations to an equation indicating the relation of an alignment condition and deviation of the sample images; and obtaining the alignment condition based on the calculated unknown and a condition in which an image deviation becomes small when the correction condition of the astigmatism corrector is changed to the two condition.

3. A charged particle beam apparatus which forms a sample image based on an output of a detector and has a charged particle source, a lens for converging a charged particle beam emitted from the charged particle source, an alignment deflector for performing an axis alignment of the said charged particle beam for the convergence lens, and the detector for detecting secondary charged articles emitted from a sample by radiating said charged particle beam thereonto, the changed particle beam apparatus comprising:

a memory for memorizing first and second sample images obtained by changing a convergence condition of said lens to two states when a deflection condition of said alignment deflector is rendered to a first state and for memorizing third and fourth sample images obtained by changing the convergence condition of said lens to two states when the deflection condition of said alignment deflector is changed to a second condition; and a control device for calculating a coefficient indicating the two dimensional deviation between said images with respect to a signal supplied to said alignment deflector based on said first and second two dimensional deviations, wherein the signal to be supplied to the alignment deflector is calculated using said coefficient such that the deviation between said images becomes zero or nearly zero.

4. The charged particle beam apparatus according to claim 3, wherein said control device calculates said aligner condition based on a condition in which the deviation between sample images obtained by changing the condition of said convergence lens to the two states.

5. The charged particle beam apparatus according to claim 3, wherein said control device controls said lens and said alignment detector so that said first and third sample images are obtained by rendering said alignment deflector from the first state to the second state in a state where said lens is rendered to a certain convergence condition and then said second and fourth sample images are obtained in a state where said lens is rendered to other convergence conditions.

6. The charged particle beam apparatus according to claim 3, wherein said control device acquires at least said four sample images and then restores the deflection condition of the alignment deflector to an optical condition when said first sample image is acquired, thus calculating a drift amount based on the deviation between both sample images.

7. A charged particle beam apparatus which forms a sample image based on an output of a detector and has a charged particle source, an astigmatism corrector for performing an astigmatism correction of a charged particle beam emitted from the charged particle source, an alignment deflector for performing an axis alignment of the said charged particle beam for said astigmatism corrector, and the detector for detecting secondary charged particles emitted from a sample by radiating said charged particle beam thereonto, the charged particle beam apparatus comprising:

a memory for memorizing first and second sample images obtained by changing a correction condition of said astigmatism corrector when a deflection condition of said alignment deflector is rendered to a first state and for memorizing third and fourth sample images obtained by changing the correction condition of said astigmatism corrector to two states when the deflection condition of said alignment deflector is changed to a second condition; and a control device for calculating a coefficient indicating the two dimensional deviation between said images with respect to a signal supplied to said alignment deflector based on said first and second two dimensional deviations, wherein the signal to be supplied to the alignment deflector is calculated using said coefficient such that the deviation between said images becomes zero or nearly zero.

8. The charged particle beam apparatus according to claim 7, wherein said control device calculates said aligner condition based on a condition in which the deviation between sample images obtained by changing the condition of said convergence lens to the two states.

9. The charged particle beam apparatus according to claim 7, wherein said control device acquires at least said four sample images and then restores the deflection condition of the alignment deflector to an optical condition when said first sample image is acquired, thus calculating a drift amount based on the deviation between both sample images.

10. A charged particle beam alignment method which performs an axis alignment of a charged particle beam for an optical device by an alignment deflector and uses a charged particle beam apparatus having an optical device for changing the charged particle beam emitted from a charged particle source and forming a sample image by detecting secondary charged particles emitted from a sample by radiating said charged particle beam onto the sample, which is changed by the optical device, the method comprising the steps of:

changing said optical device to at least two states when a deflection condition of said alignment deflector is rendered to a first state;

detecting a first two dimensional deviation between first and second sample images obtained when the deflection condition of said alignment condition is rendered to the first state;

changing the optical device to at least two conditions when the deflection condition of said alignment deflector is rendered to a second state;

detecting a second two dimensional deviation between third and fourth sample images obtained when the deflection condition of said alignment deflector is rendered to the second state; and calculating a coefficient indicating the deviation between said images with respect to the signal supplied to said alignment deflector based on said first two dimensional deviation and said second two dimensional deviation, wherein an operation condition of the alignment deflector is determined using said coefficient such that the deviation between said images become zero or nearly zero.

11. A charged particle beam apparatus comprising:

a charged particle source;

an optical element for adjusting a charged particle beam emitted by said charged particle source; and an alignment deflector for axis adjustment with respect to said optical element, said apparatus further comprising selection means for selecting based on a given indicator whether a coefficient indicating the sensitivity of the alignment deflector should be recalculated, or the operation condition of said alignment deflector should be determined using a coefficient that is stored in advance.

12. The charged particle beam apparatus according to claim 11, wherein said calculation means calculates the deflection amount of said alignment deflector based on a movement amount between a plurality of images obtained when a condition of said optical device is changed.

13. The charged particle beam apparatus according to claim 11, wherein said calculation means calculates the deflection amount of said alignment deflector based on a movement amount between a plurality of images, and the number of the images provided for a calculation changes depending on a selection of the calculation method by said selection means.

14. The charged particle beam apparatus according to claim 11,
wherein said calculation means computes a predetermine variable based on a movement amount between a plurality of images obtained when a condition of said optical device is changed and calculates a change amount of said alignment deflector based on the predetermined variable, and
wherein the number of the images provided for a calculation changes depending on a selection of the calculation method by said selection means.

15. A charged particle beam apparatus which has a charged particle source; an astigmatism corrector for performing an astigmatism correction of a charged particle beam emitted from said charged particle source; an objective lens disposed between said astigmatism corrector and a sample onto which said charged particle beam is radiated, the objective lens converging said charged article beam; a first alignment deflector for aligning an optical axis of said charged particle beam with said astigmatism corrector; and a second alignment corrector for aligning the optical axis of said charged particle beam with said objective lens, the charged particle beam apparatus comprising:
control means for performing a focus adjustment by us of said objective lens, for performing an axis alignment by use of said first alignment deflector, for performing an axis alignment by use of said second alignment deflector, and for performing an astigmatism correction by use of said astigmatism corrector.

16. A charged particle beam apparatus method for a charged particle beam apparatus having an optical element for varying a charged particle beam emitted by a charged particle source, and an alignment deflector for aligning the axis of the charged particle beam with respect to the optical element, wherein the apparatus forms a sample image by detecting secondary charged particles that are emitted by the sample as the sample is irradiated with the charged particle beam, the method comprising:
calculating a two dimensional deviation between images formed when a condition of said optical element is varied; and
calculating an axial adjustment condition for said alignment deflector that would make smaller said two dimensional deviation, the method further comprising:
calculating a coefficient indicating a relationship between a signal supplied to said alignment deflector and the two dimensional deviation between said images; and
calculating, based on said coefficient, a signal supplied to said alignment deflector such that the deviation between said images becomes zero or nearly zero.

17. A charged particle beam apparatus comprising:
a charged particle source;
an optical element for adjusting a charged particle beam emitted by the charged particle source;
an alignment deflector for aligning the axis of the charged particle beam with respect to the optical element;
a detector for detecting charged particles emitted by a sample as the sample is irradiated with the charged particle beam; and
a control device for calculating a two dimensional deviation between images obtained when a condition of said optical element is varied,
wherein said control device calculates a signal supplied to said alignment deflector and a coefficient indicating a variation in the deviation between said images, and calculates a signal to said alignment deflector using said coefficient such that the deviation between said images becomes zero or nearly zero.

18. The charged particle beam apparatus according to claim 17, the apparatus further comprising:
calculation means for calculating a deflection amount of the alignment deflector based on a movement amount between a plurality of images obtained when a condition of said optical device is changed, wherein
the plurality of images obtained when the condition of said optical device is changed are displayed.

19. The charged particle beam apparatus according to claim 17, the apparatus further comprising:
means for emitting an alarm when the deviation between the images, which results when the optical element condition is varied, exceeds a predetermined range, or when there is no structural information on the images that is necessary for the detection of an image deviation.

20. The charged particle beam apparatus according to claim 17, the apparatus further comprising:
means for calculating an alignment condition of the alignment deflector based on information obtained from the sample image;
means for quantizing the sample image; and
means for emitting an alarm when a quantized value obtained by the quantization means is equal to or below a predetermined value.

21. The charged particle beam apparatus according to claim 17, the apparatus further comprising:
means for measuring the width of an object on the sample based on a line profile obtained by scanning the sample with the charged particle beam either one or two dimensionally; and
means for registering at least one of the sample image, the line profile and the optical condition of the charged particle beam, when the deviation between the images, which results when the optical element condition is varied, exceeds a predetermined range, or when there is no structural information on the images that is necessary for the detection of an image deviation.

22. The charged particle beam apparatus according to claim 17, the apparatus further comprising:
means for measuring the width of an object on the sample based on a line profile obtained by scanning the sample with the charged particle beam either one or two dimensionally;
means for calculating an alignment condition of the alignment deflector based on information obtained from the sample image;
means for quantifying the sample image; and
means for registering at least one of the sample image, the line profile and the optical condition of the charged particle beam, when the deviation between the images, which results when the optical element condition is varied, exceeds predetermined range, or when there is no structural information on the images that is necessary for the detection of an image deviation.

23. The charged particle beam apparatus according to claim 17, the apparatus further comprising:

means for forming an image based on secondary charged particles obtained by scanning a sample with the charged particle beam; and means for calculating a deflection amount of the alignment detector based on information about the image, wherein the processing by the calculating means is repeated when the amount of deflection calculated by the calculating means is equal to or more than a predetermined value.

24. The charged particle beam apparatus according to claim 17, the apparatus further comprising:

means for detecting centers of gravity in the patterns of two images obtained when the charged particle beam scans while changing a condition of the optical element; and means for calculating a deflection amount of the alignment detector based on a deviation between the centers of gravity of the two patterns.

\* \* \* \* \*